(12) United States Patent
Ossimitz

(10) Patent No.: US 8,399,265 B2
(45) Date of Patent: Mar. 19, 2013

(54) DEVICE FOR RELEASABLY RECEIVING A SEMICONDUCTOR CHIP

(75) Inventor: Peter Ossimitz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 13/047,186

(22) Filed: Mar. 14, 2011

(65) Prior Publication Data

US 2012/0238042 A1    Sep. 20, 2012

(51) Int. Cl.
  *G01R 31/26* (2006.01)
  *H01L 21/66* (2006.01)

(52) U.S. Cl. .............. 438/14; 438/15; 438/17; 438/106; 257/E21.529; 257/E21.511; 257/E23.023

(58) Field of Classification Search .............. 438/14, 438/18, 108, 612; 257/47, 48, 738, 741, 257/778, 779, E21.476
See application file for complete search history.

(56) References Cited

U.S. PATENT DOCUMENTS

| | | | |
|---|---|---|---|
| 5,949,242 A | 9/1999 | Wood et al. | |
| 7,023,701 B2 * | 4/2006 | Stocken et al. | 361/704 |
| 2001/0001216 A1 * | 5/2001 | LaFontaine et al. | 257/738 |
| 2003/0052319 A1 | 3/2003 | Chen et al. | |
| 2003/0237061 A1 | 12/2003 | Miller et al. | |
| 2004/0189333 A1 | 9/2004 | Dobritz et al. | |
| 2005/0014394 A1 | 1/2005 | Hedler et al. | |
| 2006/0043604 A1 * | 3/2006 | Suga et al. | 257/778 |
| 2007/0020912 A1 * | 1/2007 | Nishiyama et al. | 438/613 |
| 2011/0148812 A1 * | 6/2011 | Hente | 345/174 |

FOREIGN PATENT DOCUMENTS

| | | |
|---|---|---|
| DE | 103 40 333 A1 | 7/2004 |
| DE | 103 24 450 A1 | 1/2005 |

* cited by examiner

Primary Examiner — Charles Garber
Assistant Examiner — Abdulfattah Mustapha
(74) Attorney, Agent, or Firm — Slater & Matsil, L.L.P.

(57) ABSTRACT

A device is disclosed for releasably receiving a singulated semiconductor chip having a first main surface and a second main surface opposite the first main surface. The device includes a support structure. At least one elastic element is arranged on the support structure. Electrical contact elements are arranged on the at least one elastic element and adapted to be contacted to the first main surface of the semiconductor chip. A foil is adapted to be arranged over the second main surface of the semiconductor chip.

24 Claims, 29 Drawing Sheets

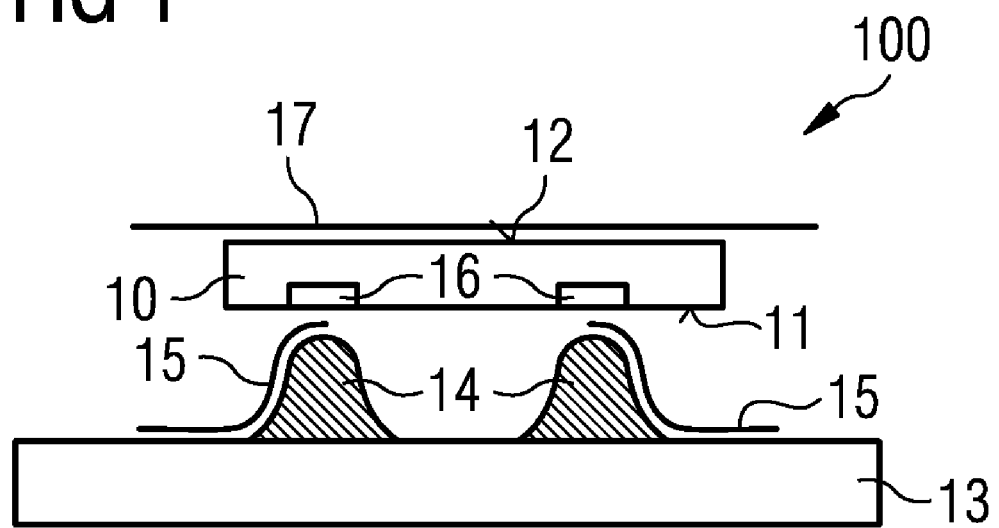

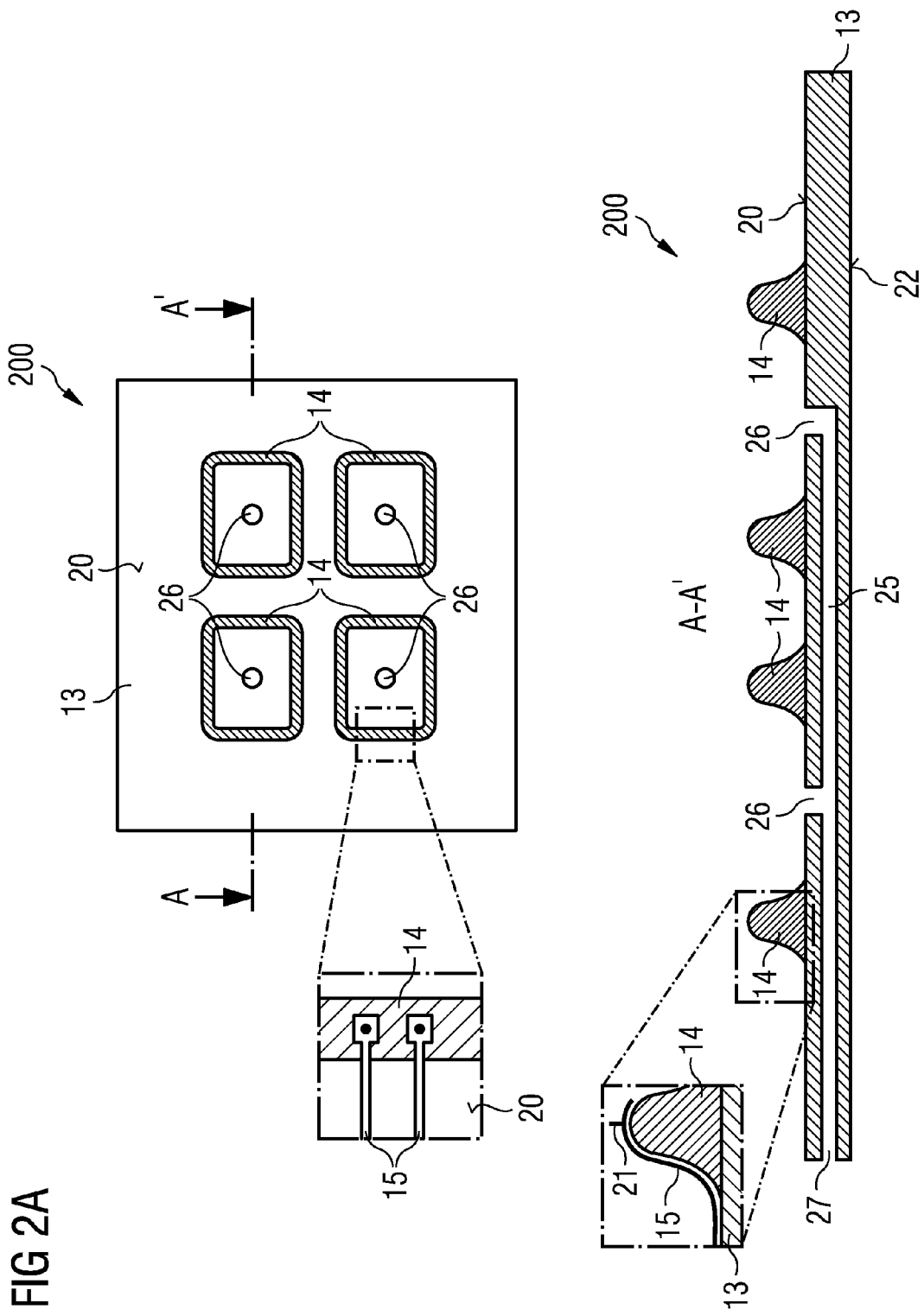

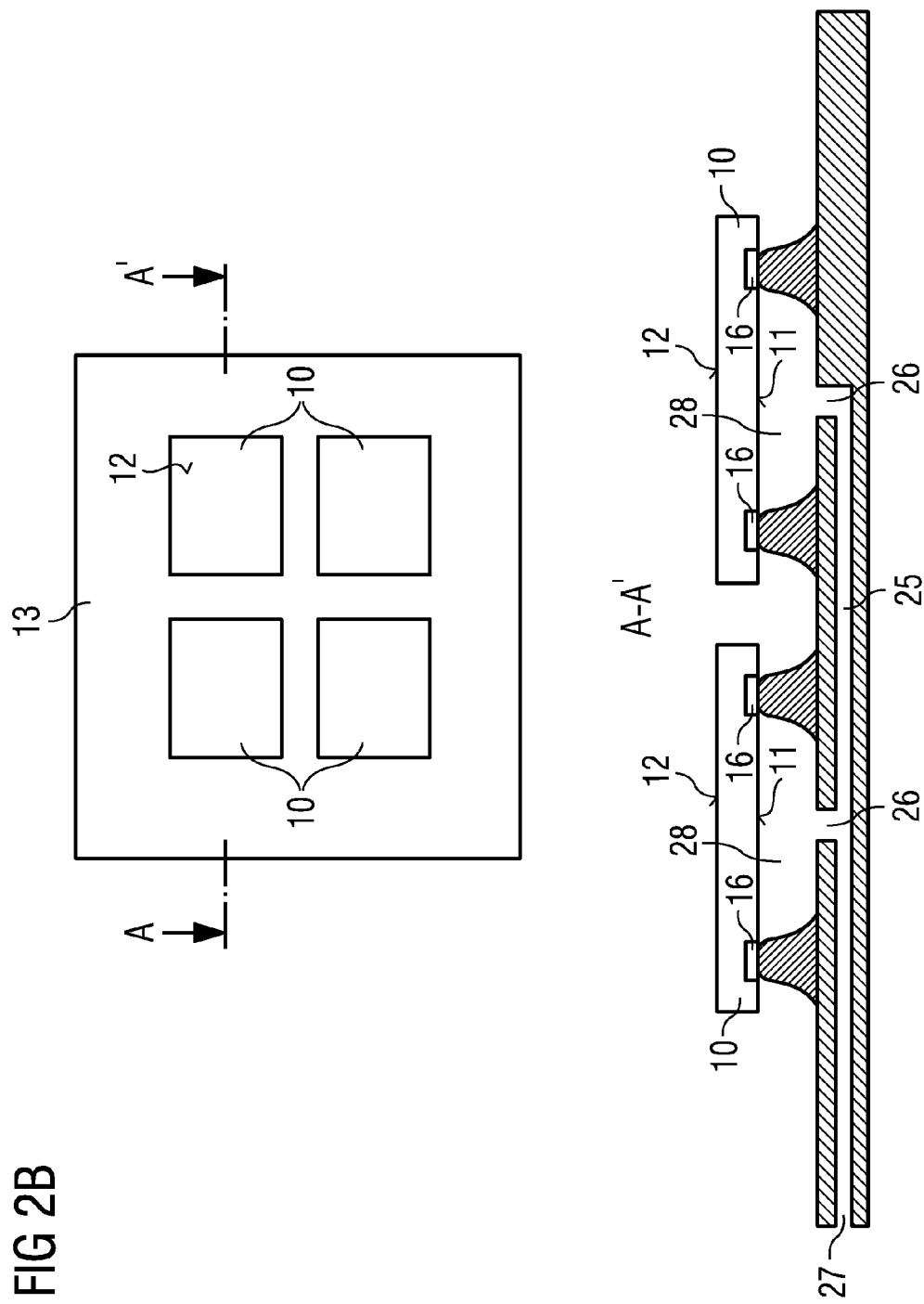

FIG 2C
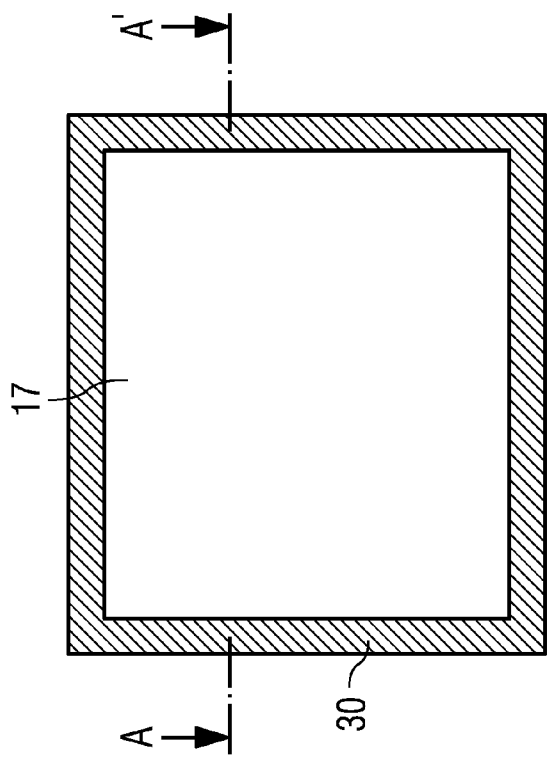
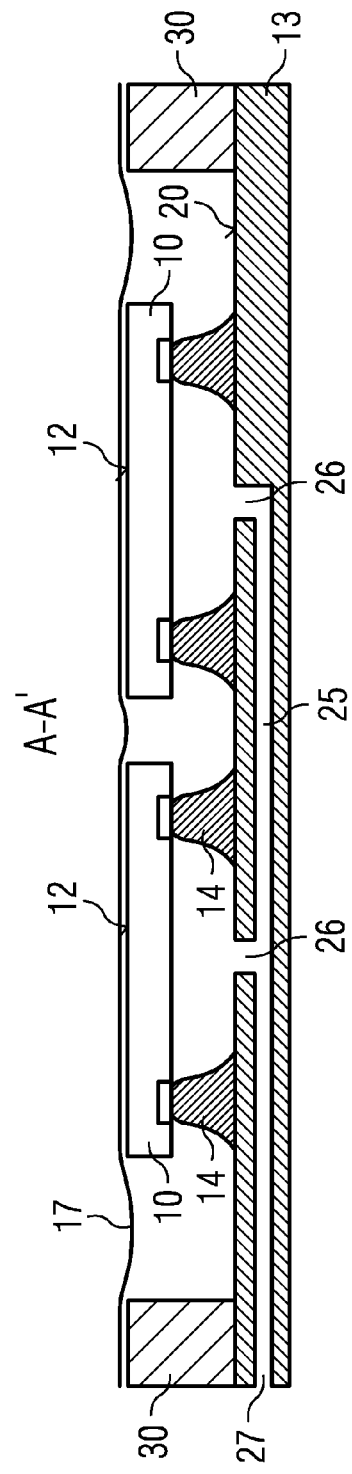

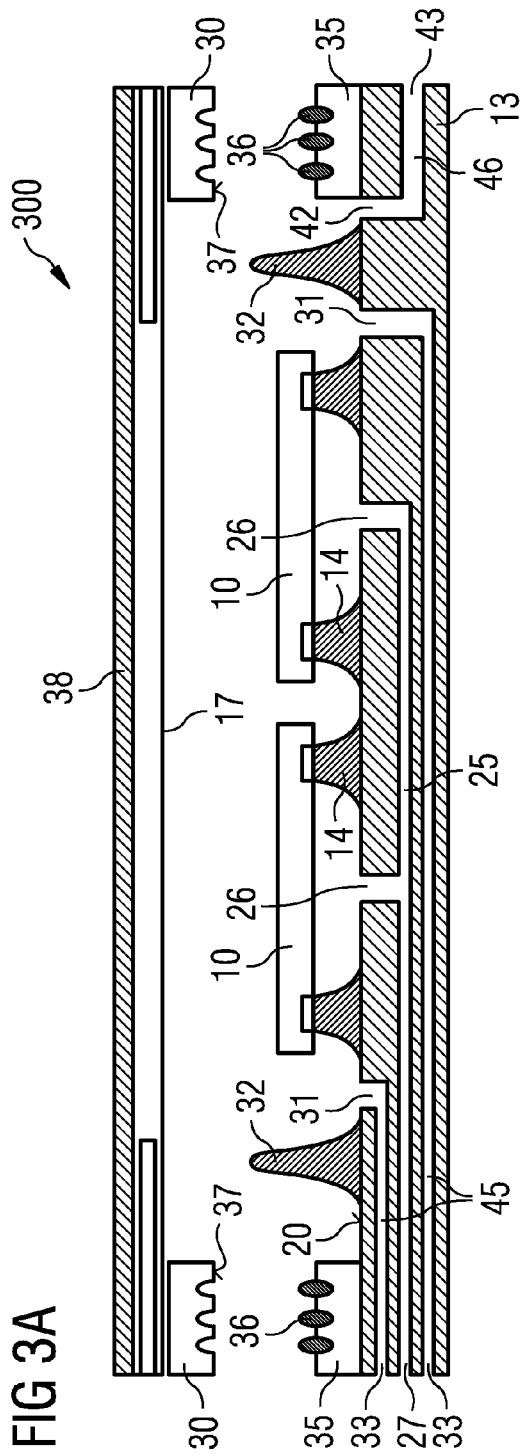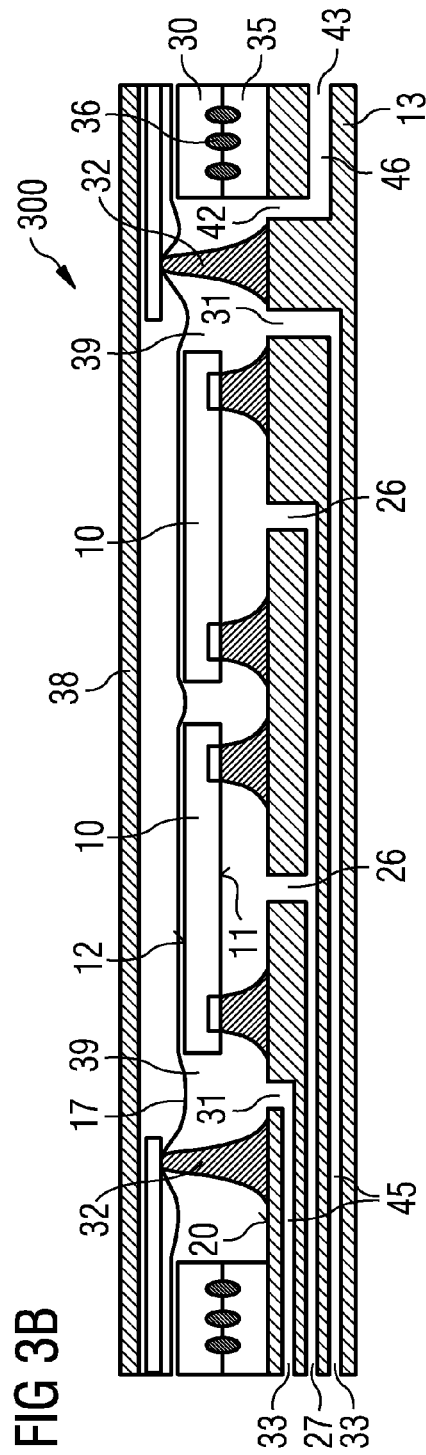

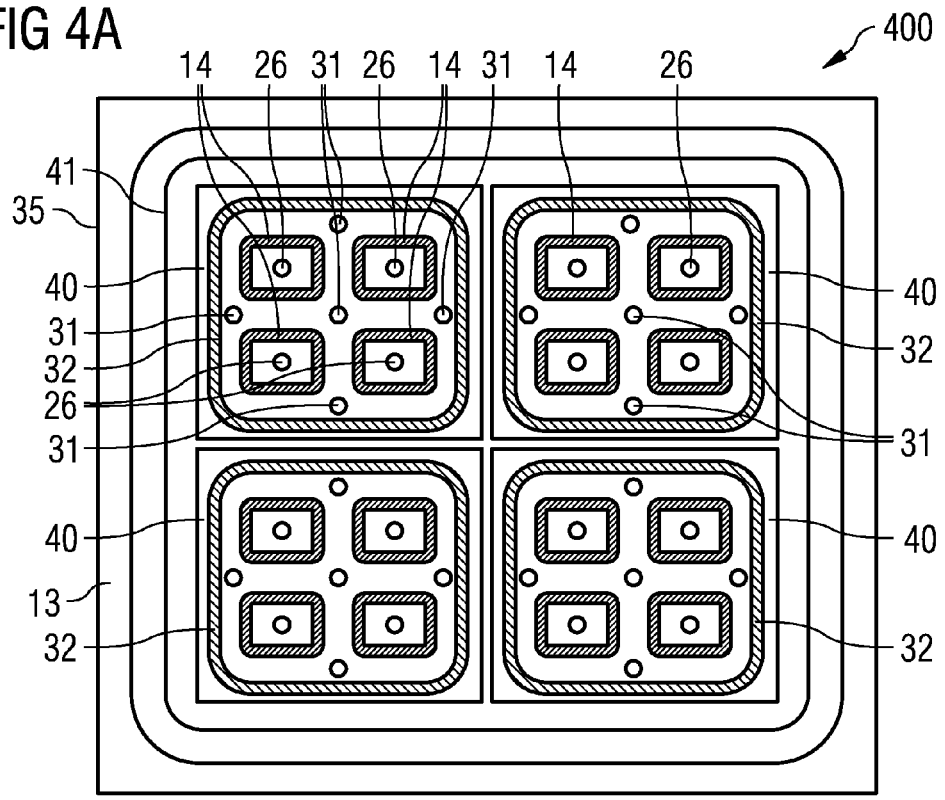
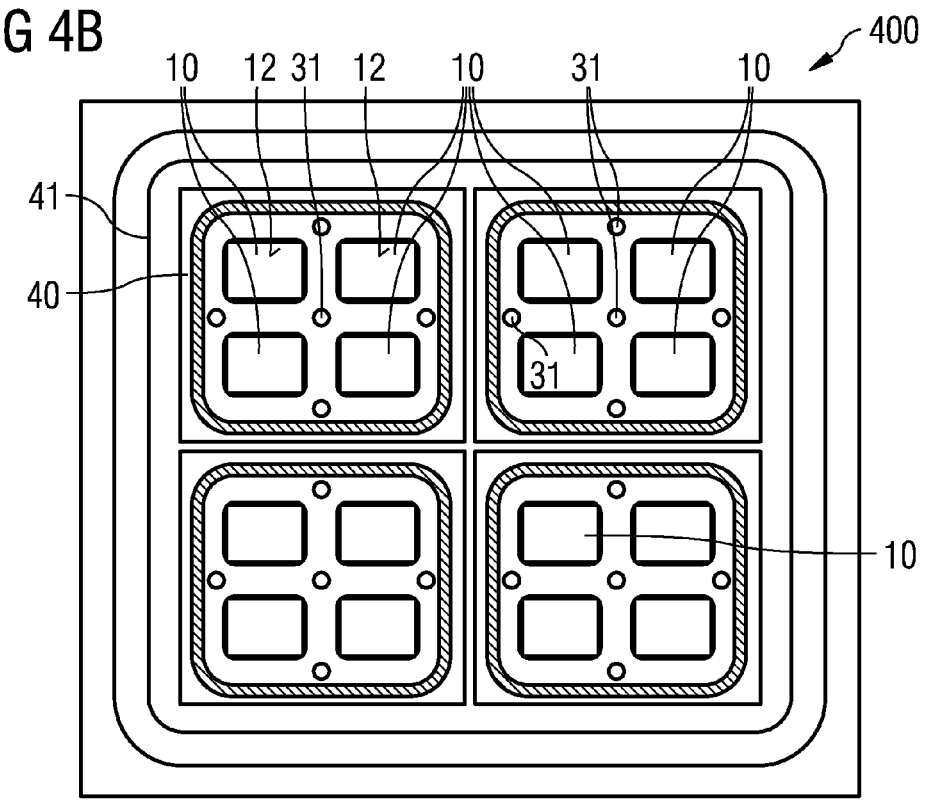

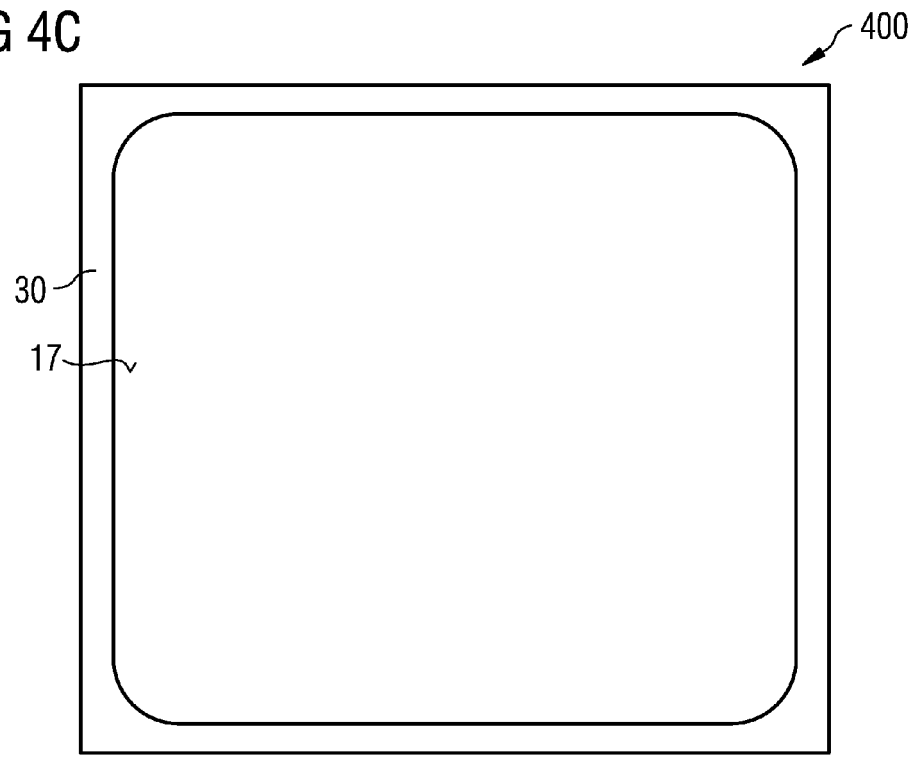
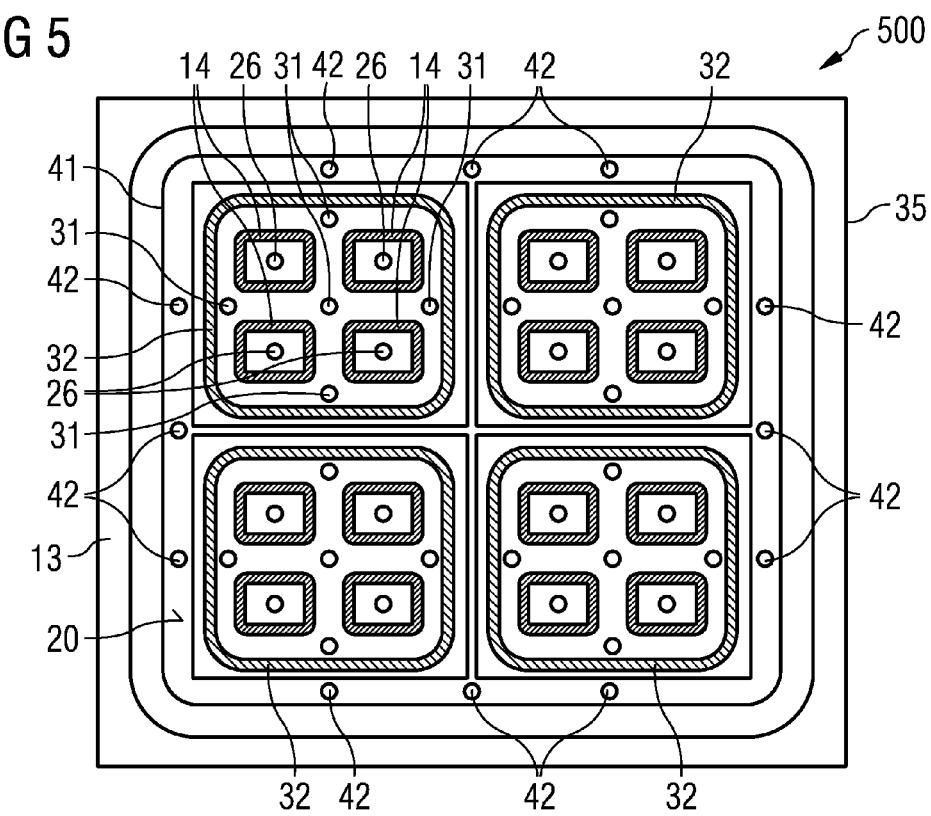

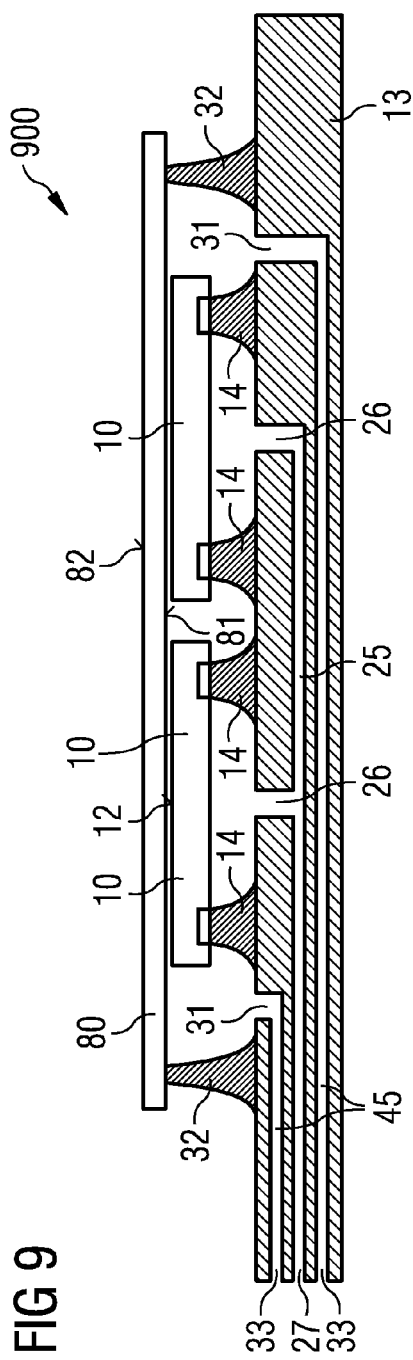
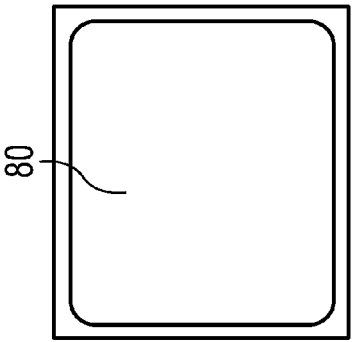
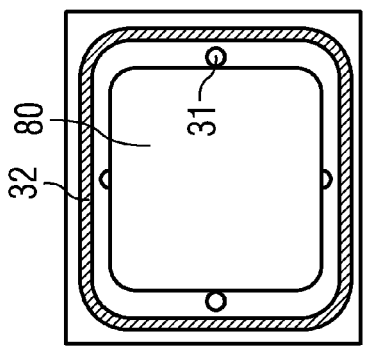
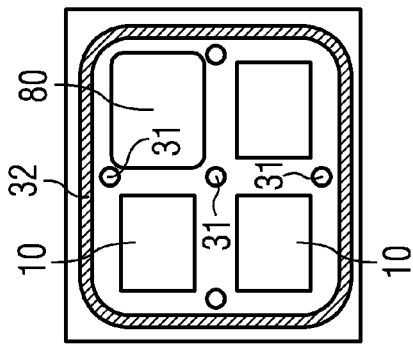

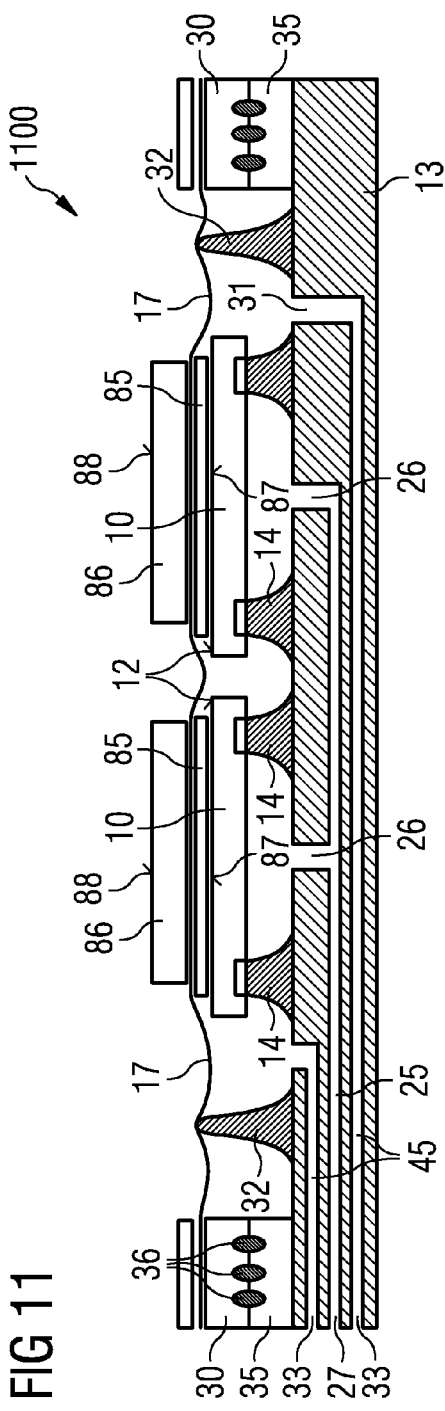
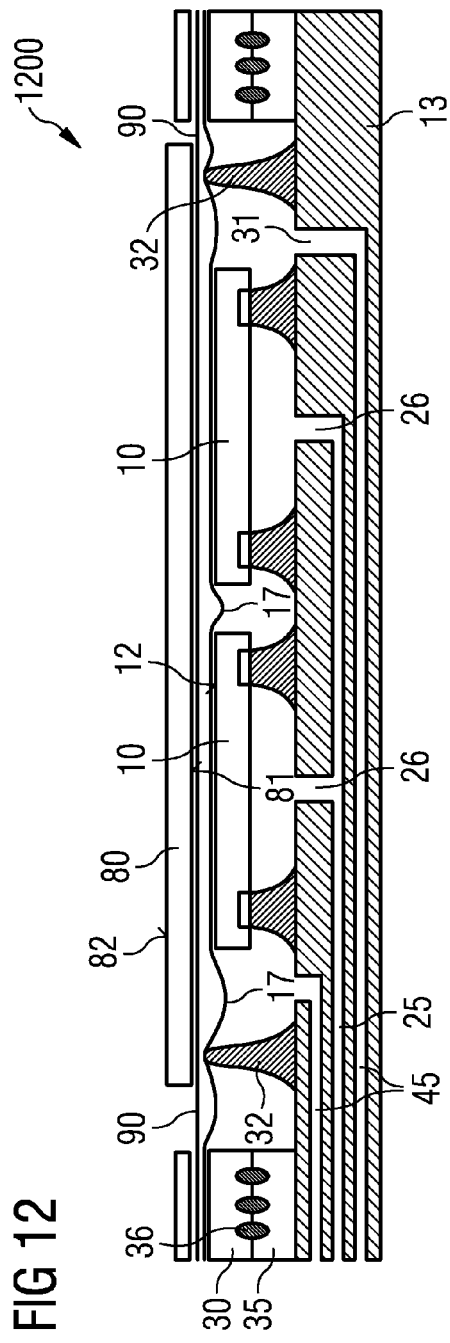

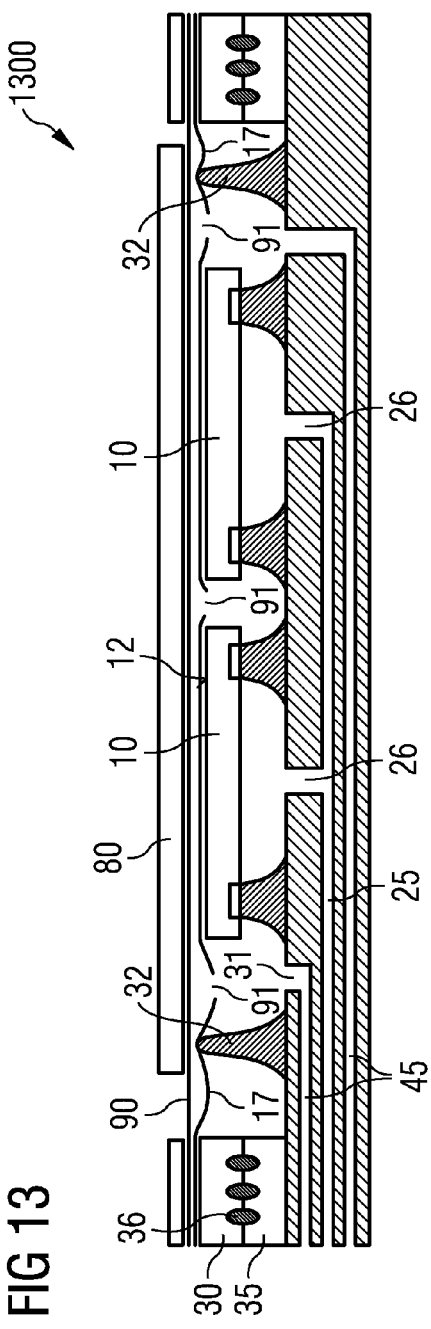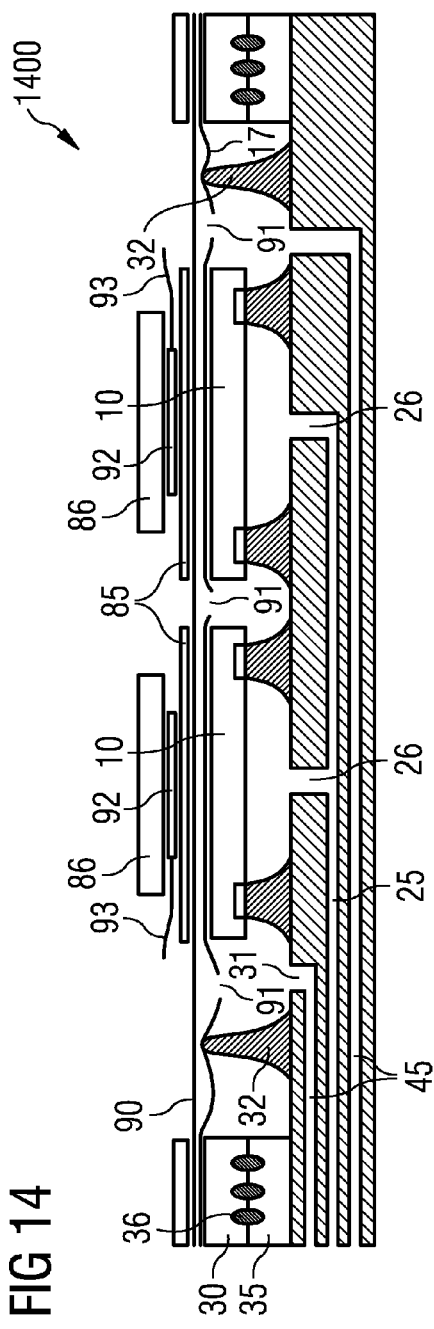

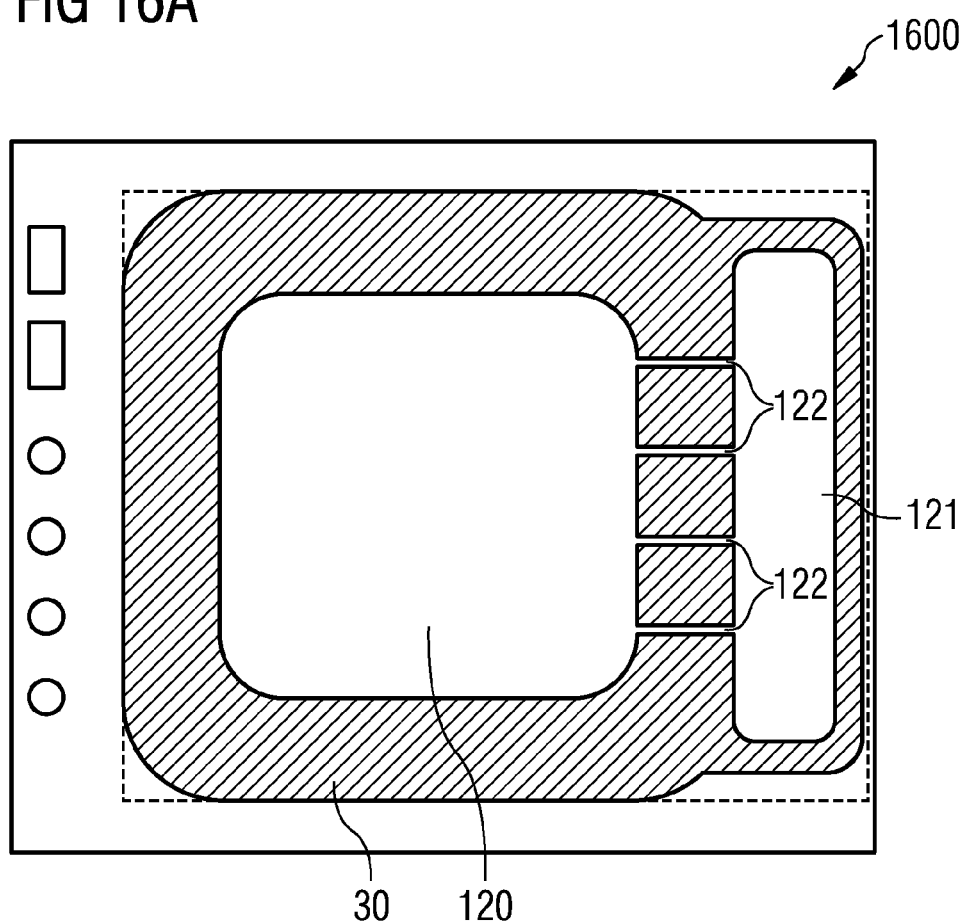

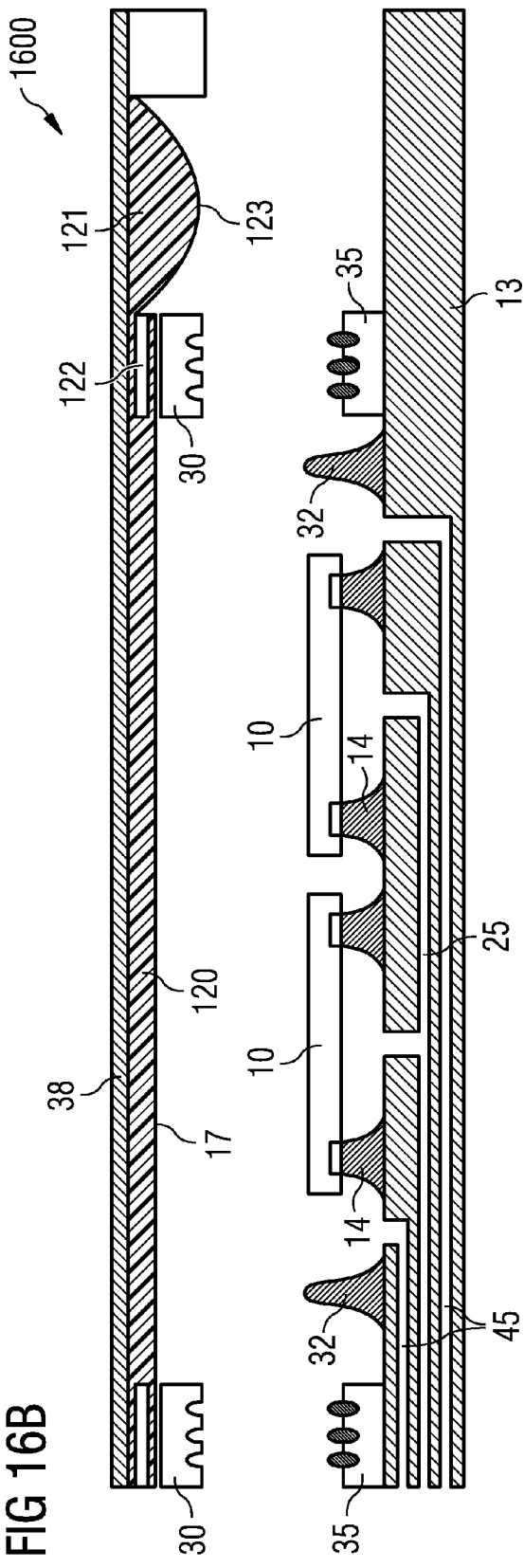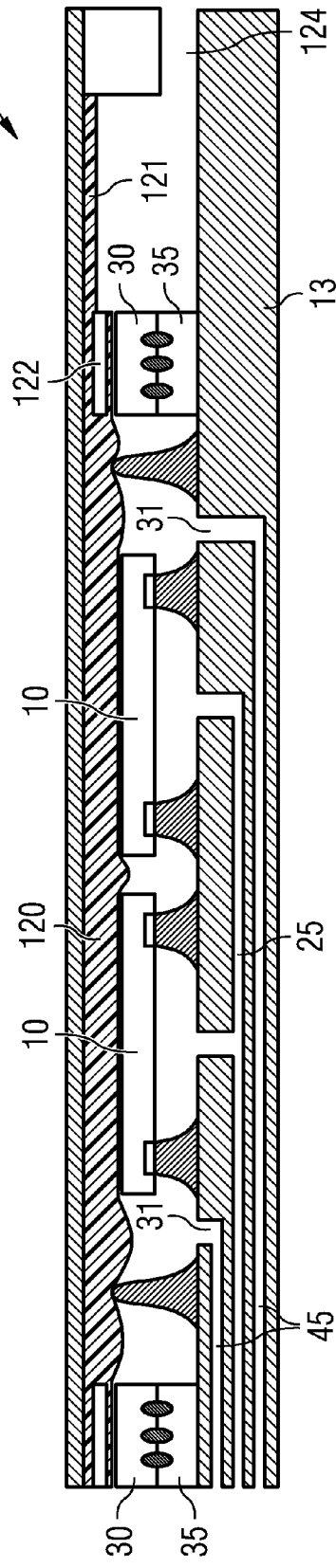

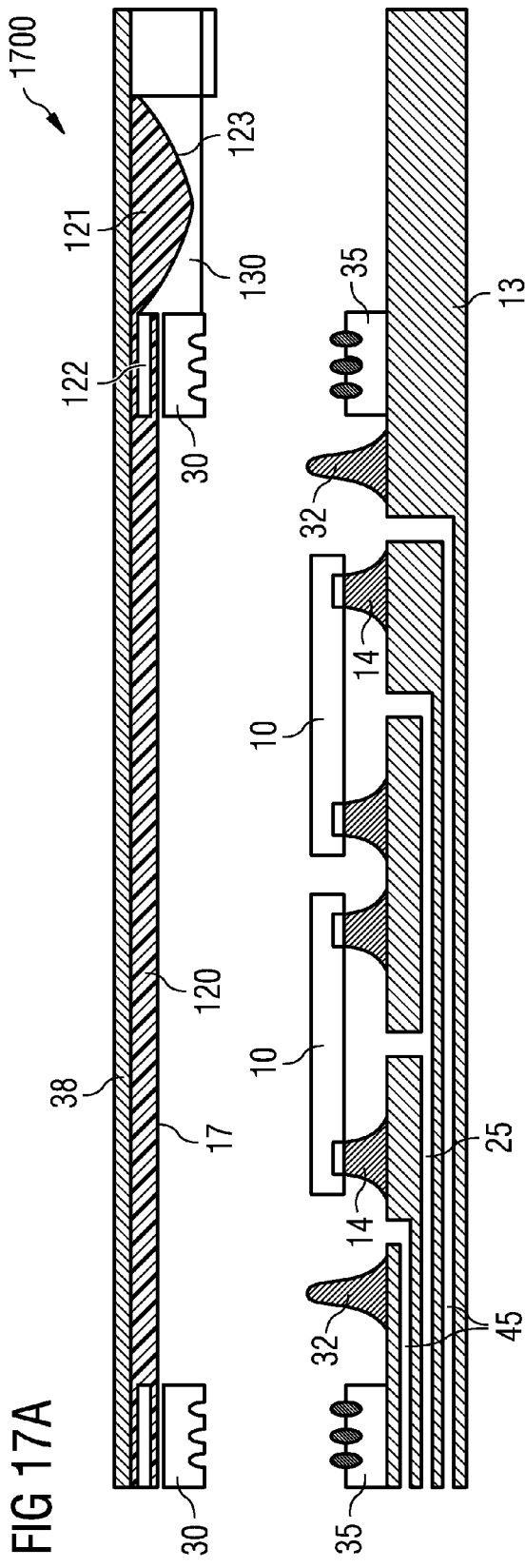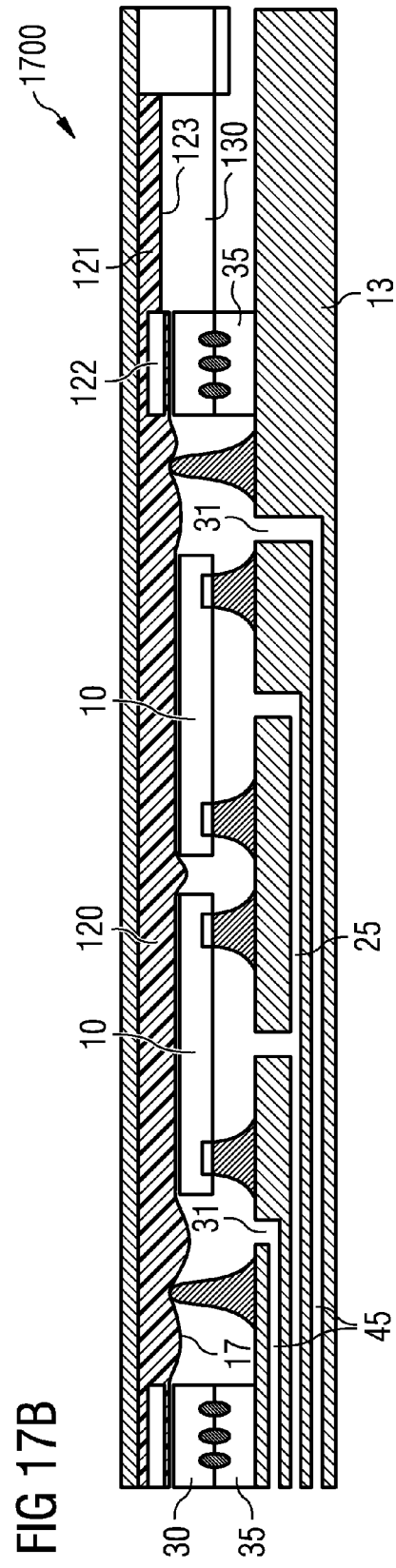

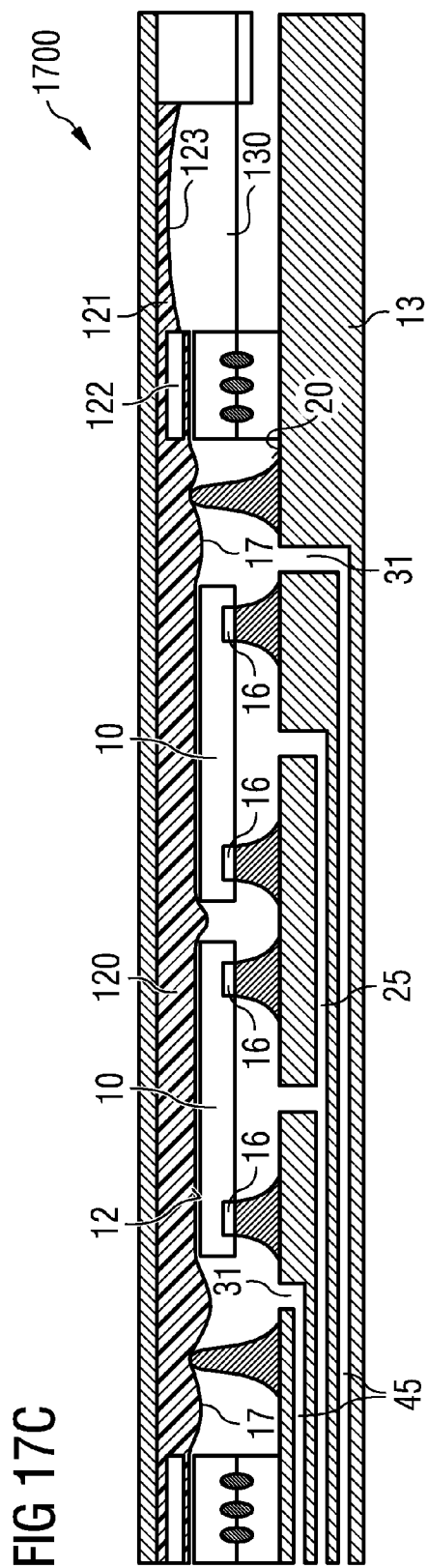

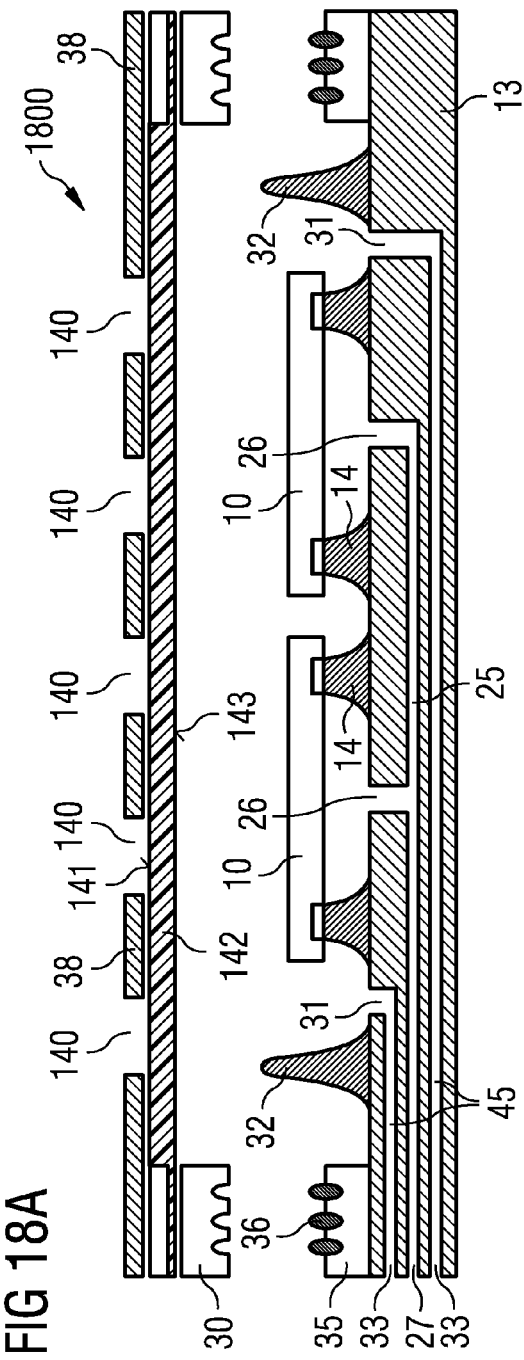
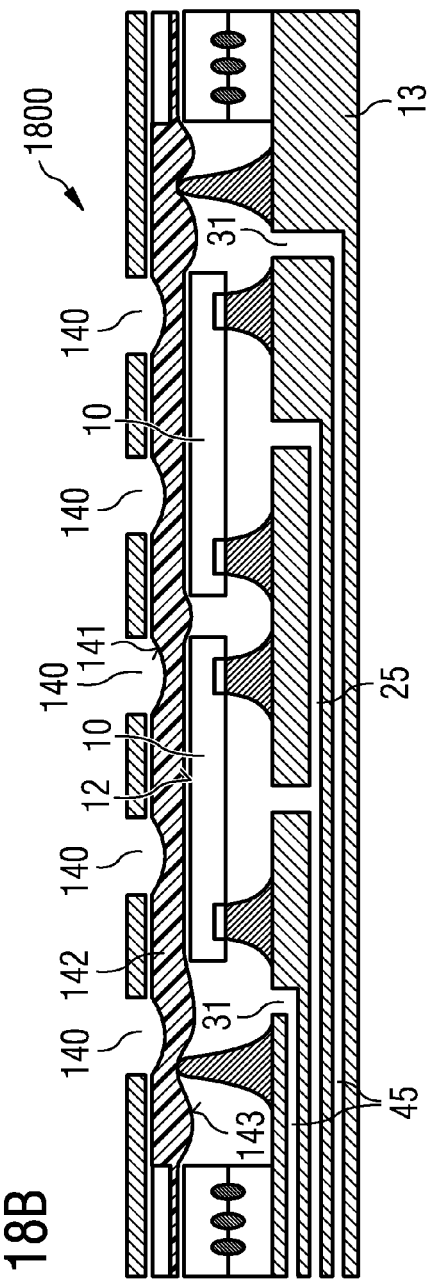
FIG 18A
FIG 18B

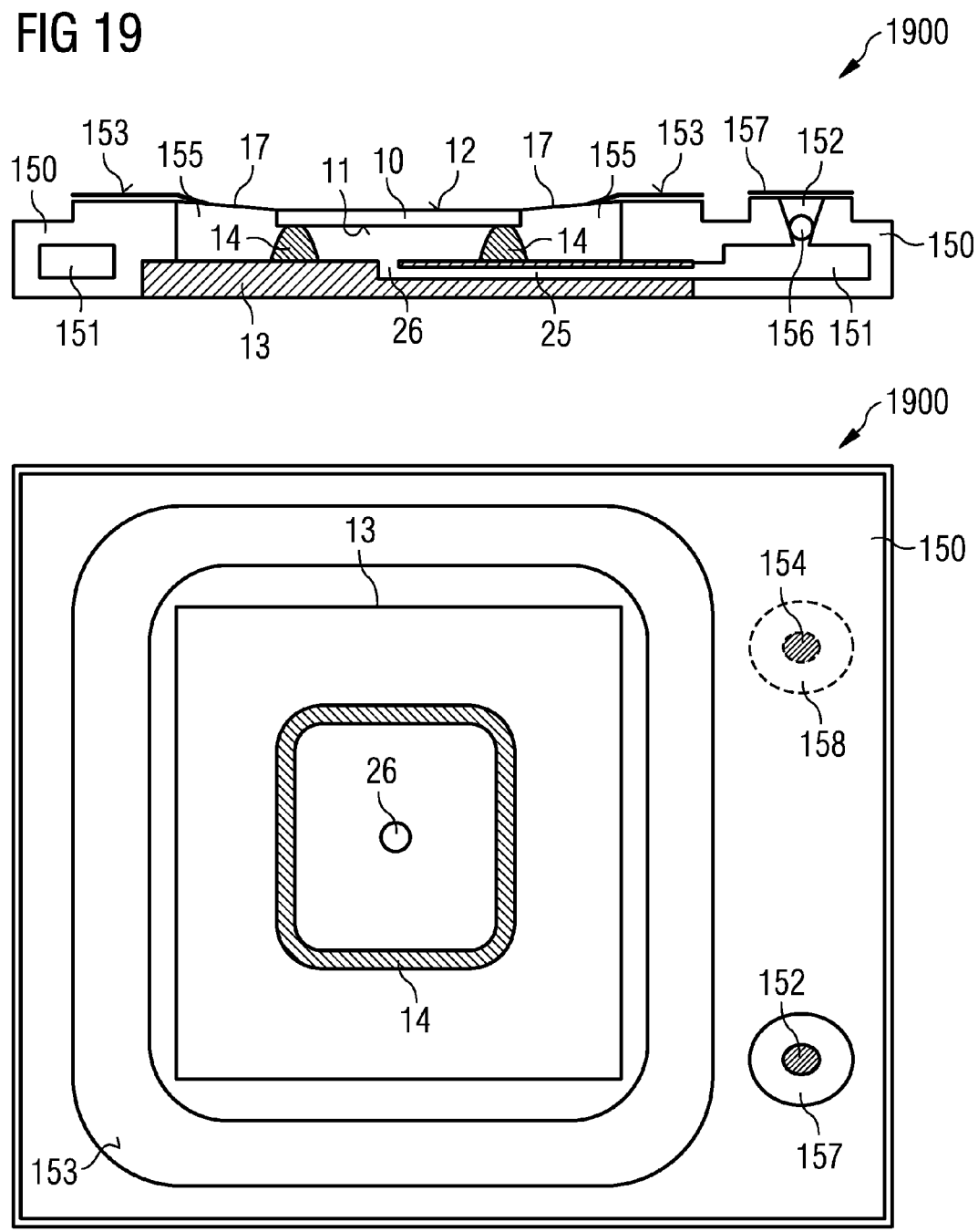

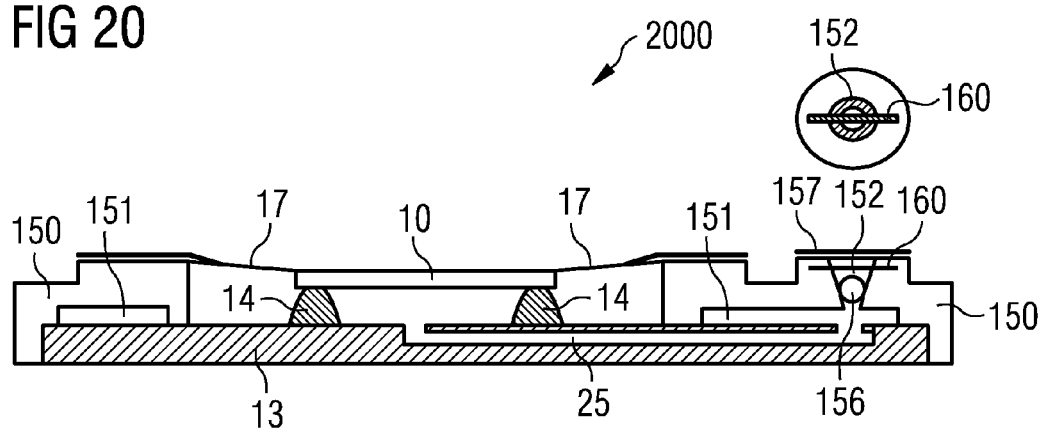
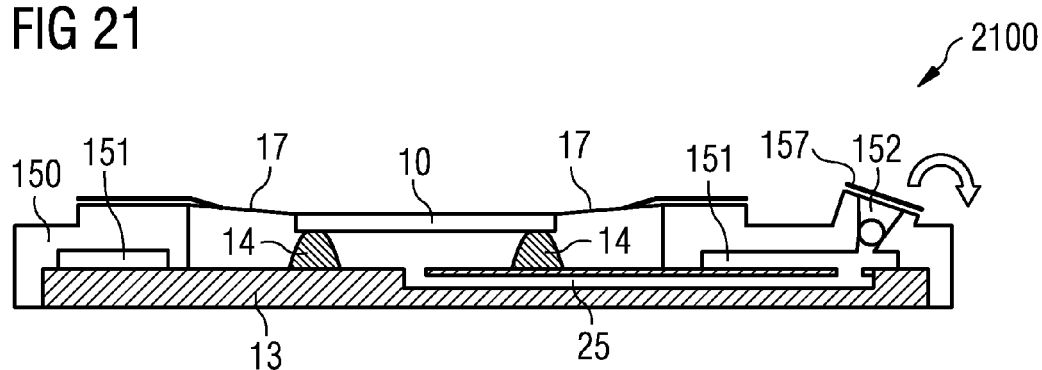
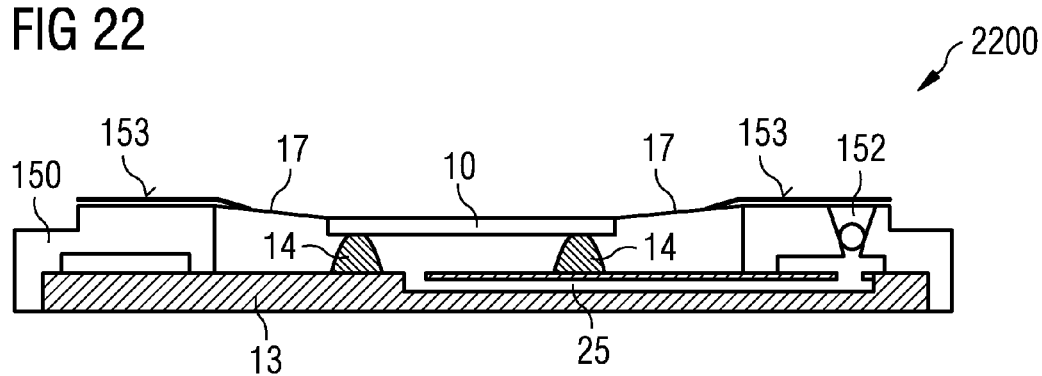

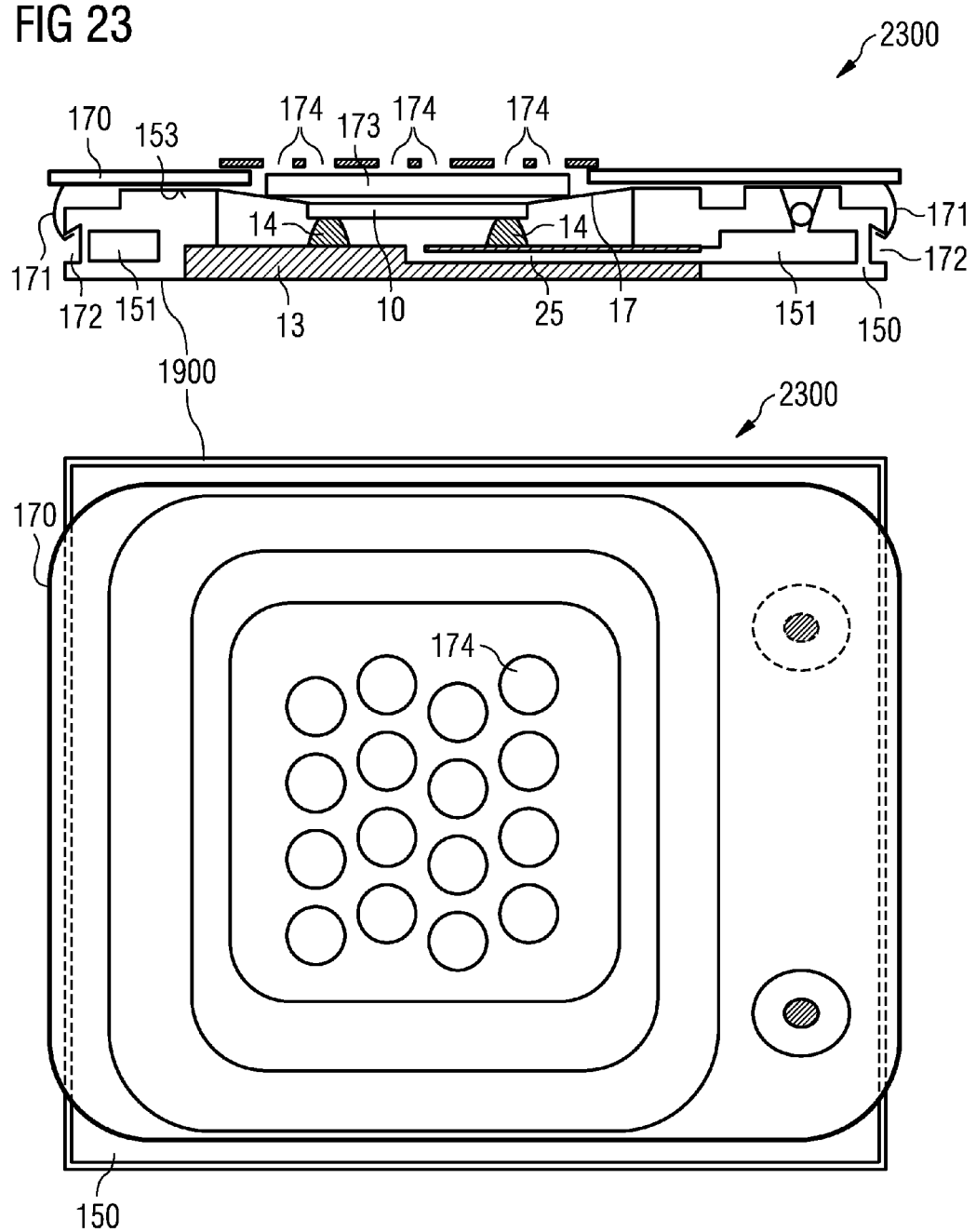

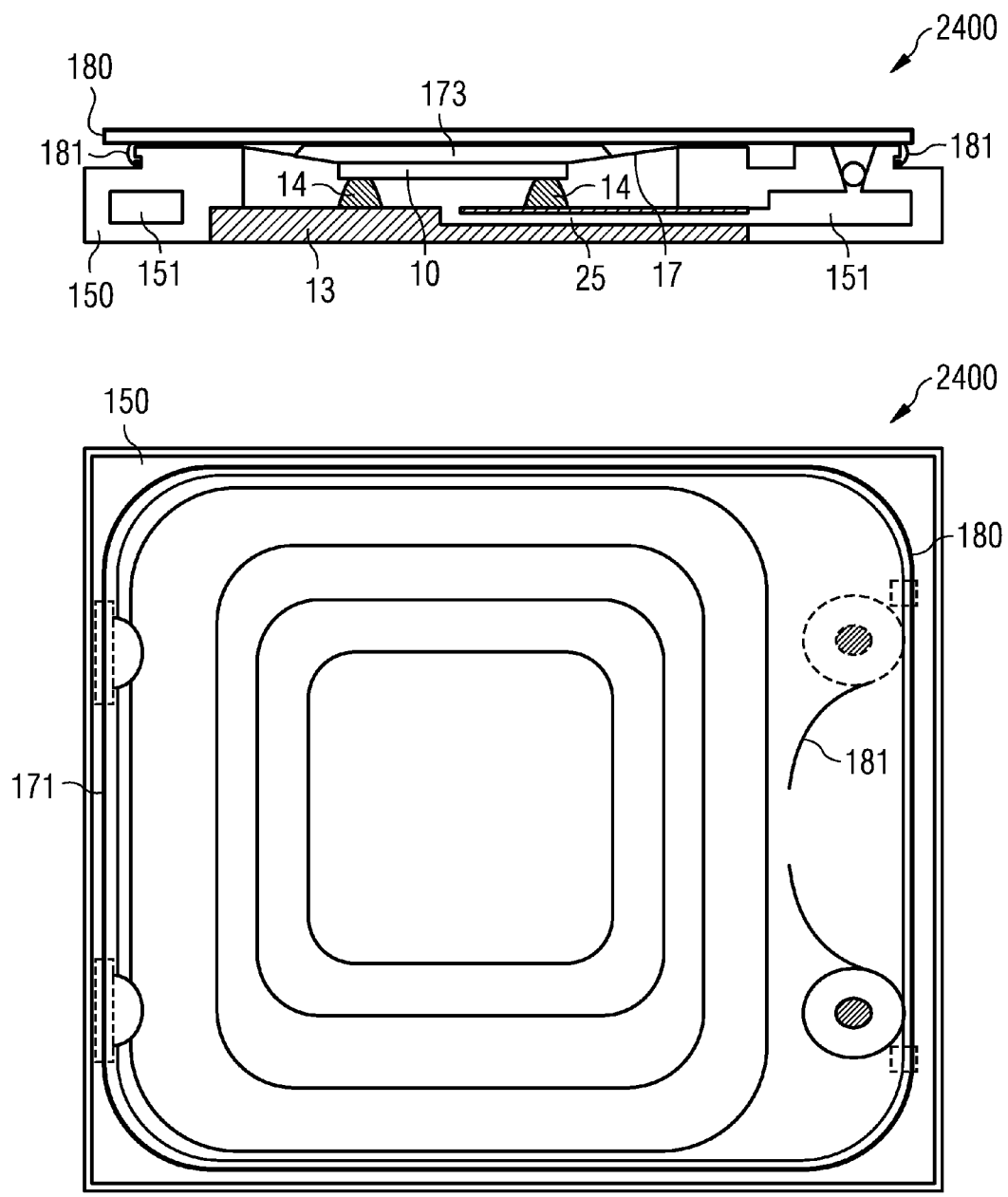

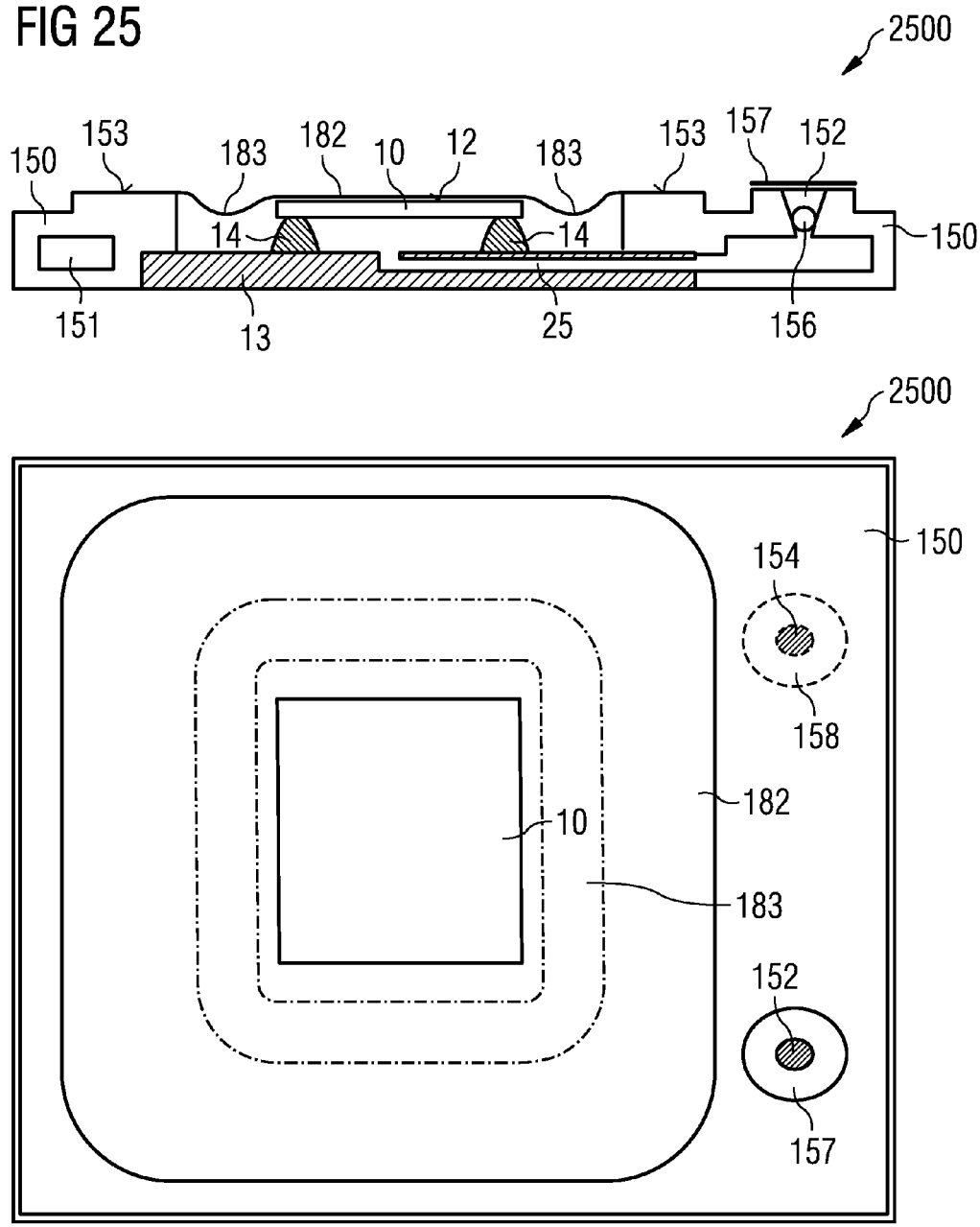

DEVICE FOR RELEASABLY RECEIVING A SEMICONDUCTOR CHIP

TECHNICAL FIELD

This invention relates to a device for releasably receiving a singulated semiconductor chip and a method for testing a singulated semiconductor chip.

BACKGROUND

After the singulation of semiconductor chips from a semiconductor wafer, each semiconductor chip may be tested to measure its quality and reliability. Testing may include burn-in testing wherein the semiconductor chip is exposed to a wide temperature range while the integrated circuit included in the semiconductor chip is tested. In addition, the semiconductor chip may be subject to speed and/or functionality tests to check the performance of the integrated circuits. During testing, the quality of the contact pads arranged on the semiconductor chip may also be tested.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 schematically illustrates a cross-sectional view of one embodiment of a device including a support structure for releasably receiving a singulated semiconductor chip;

FIGS. 2A-2C schematically illustrate cross-sectional and plan views of one embodiment of a device including a support structure for releasably receiving singulated semiconductor chips and channels extending through the support structure to create a vacuum for temporarily holding the semiconductor chips in place;

FIGS. 3A-3B schematically illustrate cross-sectional views of one embodiment of a device including a support structure for releasably receiving singulated semiconductor chips and a plurality of channels extending through the support structure to create a vacuum to apply a force to a foil placed over the semiconductor chips;

FIGS. 4A-4C schematically illustrate plan views of one embodiment of a device including a support structure for releasably receiving singulated semiconductor chips and a plurality of channels extending through the support structure;

FIG. 5 schematically illustrates a plan view of one embodiment of a device including a support structure for releasably receiving singulated semiconductor chips and a plurality of openings in the support structure;

FIG. 9 schematically illustrates a cross-sectional view of one embodiment of a device including a support structure for releasably receiving singulated semiconductor chips and a plate arranged over the semiconductor chips;

FIGS. 10A-10C schematically illustrate plan views of embodiments of a support structure for releasably receiving singulated semiconductor chips and a plate arranged over the semiconductor chips;

FIG. 11 schematically illustrates a cross-sectional view of one embodiment of a device including a support structure for releasably receiving singulated semiconductor chips and individual plates arranged over the semiconductor chips;

FIG. 12 schematically illustrates a cross-sectional view of one embodiment of a device including a support structure for releasably receiving singulated semiconductor chips and two foils as well as a plate arranged over the semiconductor chips;

FIG. 13 schematically illustrates a cross-sectional view of one embodiment of a device including a support structure for releasably receiving singulated semiconductor chips and two foils as well as a plate arranged over the semiconductor chips;

FIG. 14 schematically illustrates a cross-sectional view of one embodiment of a device including a support structure for releasably receiving singulated semiconductor chips and Peltier elements arranged over the semiconductor chips;

FIGS. 16A-16C schematically illustrate one embodiment of a frame to be mounted on a support structure for releasably receiving singulated semiconductor chips;

FIGS. 17A-17C schematically illustrate one embodiment of a frame to be mounted on a support structure for releasably receiving singulated semiconductor chips;

FIGS. 18A-18B schematically illustrate one embodiment of a frame to be mounted on a support structure for releasably receiving singulated semiconductor chips;

FIGS. 19-22 schematically illustrate cross-sectional and plan views of embodiments of a device including a support structure for releasably receiving a singulated semiconductor chip and a foil placed over the semiconductor chip;

FIGS. 23-24 schematically illustrate cross-sectional and plan views of embodiments of a device including a support structure for releasably receiving a singulated semiconductor chip, a foil placed over the semiconductor chip and a gel pad placed over the foil;

FIG. 25 schematically illustrates cross-sectional and plan views of an embodiment of a device including a support structure for releasably receiving a singulated semiconductor chip and an aluminum foil placed over the semiconductor chip;

DETAILED DESCRIPTION OF ILLUSTRATIVE EMBODIMENTS

Figure 6A:
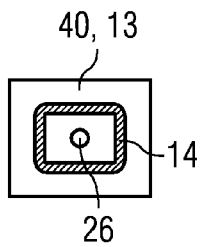
FIGS. 6A-6I schematically illustrate plan views of embodiments of a support structure and elastic elements arranged on the support structure.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices that temporarily contain semiconductor chips in order to test the semiconductor chips are described below. The semiconductor chips may be of different types, may be manufactured by different technologies and may include integrated circuits, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives and/or chip stacks. Semiconductor chips in which such functional elements are embedded generally contain electronic circuits which serve for driving the functional elements or further process signals generated by the functional elements. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals. The semiconductor chips may be singulated from semiconductor wafers. The semiconductor chips may not be packaged when they are tested, i.e., the semiconductor chips may be bare semiconductor chips.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

The devices described below include a support structure that may be formed from a ceramic or silicon material or may be a PCB (printed circuit board). One or more elastic (or resilient) elements are arranged on the support structure. The elastic elements may be made from an elastic material, for example, silicone. Electrical contact elements in the form of conductor tracks may be deposited on top of the elastic elements. The electrical contact elements deposited on the elastic elements may be connected to conductor tracks in or on the support structure. When the semiconductor chips are placed over the elastic elements with their contact pads facing the elastic elements, all or some of the contact pads of the semiconductor chips are in electrical contact with the electrical contact elements on the elastic elements. This allows performance of electrical tests on the semiconductor chips.

One or more foils (or tapes or membranes) may be placed over the semiconductor chips. The foils may be temporarily fastened to the support structure. The foils may be flexible or resilient and may be made of a silicone material or any other appropriate material. The foils allow a good thermal connection of the semiconductor chips to the environment. In this way the (inner) temperature of the semiconductor chips is well controlled when the semiconductor chips are placed in a heating or cooling device to heat or cool the semiconductor chips.

One or more elastic (or resilient) walls are arranged on the support structure. The elastic walls may be made from an elastic material, for example, silicone. Each of the elastic walls may surround one or more elastic elements. When a foil is placed over the semiconductor chips to be tested, the elastic walls may provide an air tight seal so that a vacuum can be applied which pulls the foil down to the support structure.

One or more plates may be placed over the semiconductor chips. The plates may be of any shape and size. The plates are thermally conductive and may, for example, serve as heat sinks or cooling plates for dissipating the heat generated by the semiconductor chips. The plates ensure a good thermal connection of the semiconductor chips to their environment. The plates may be composed of any desired metal or metal alloy, such as copper, aluminum or nickel, or other appropriate materials, such as plastics, which are not electrically conductive but thermally conductive.

FIG. 1 schematically illustrates a device 100 for releasably (temporarily) receiving a singulated semiconductor chip (die) 10 in cross section. The semiconductor chip 10 has a first main surface 11 and a second main surface 12, which is opposite to the first main surface 11. The device 100 includes a support structure 13 and at least one elastic element 14 arranged on the support structure 13. An electrical contact element 15 is arranged on the at least one elastic element 14. The electrical contact element 15 is adapted to be contacted to the first main surface 11 of the semiconductor chip 10. In particular, the electrical contact element 15 may be electrically contacted to contact pads 16 of the semiconductor chip 10. In addition, the device 100 includes a foil 17, which is adapted to be arranged over the second main surface 12 of the semiconductor chip 10. The foil 17 may be releasably (temporarily) attached to the support structure 13. When the foil 17 is attached to the support structure 13, it may be securely attached. In particular, the foil 17 may be made of an elastic material.

The semiconductor chip can be fabricated as is known in the art. For example, a semiconductor (e.g., silicon) wafer can be processed by implanting, depositing and etching various layers to form a plurality of chips or dies. The wafer can then be singulated to separate the wafer into the individual chips.

FIGS. 2A-2C schematically illustrate a device 200 for releasably receiving singulated semiconductor chips 10 in top plan view (top) and cross section (bottom) along the line A-A' depicted in the top plan view. The device 200 is an implementation of the device 100. The details of the device 200 that are described below can therefore be likewise applied to the device 100.

In the embodiment illustrated in FIG. 2A four elastic elements 14 are fitted on the support structure 13. In another embodiment, any other number of elastic elements 14 may be arranged on the support structure 13. In top plan view each of the elastic elements 14 may have the shape of a closed curve, which is a curve with no endpoints and which completely encloses an area of the top surface 20 of the support structure 13. The closed curves formed by the elastic elements 14 may have, in top plan view, the shape of a semi-rectangle with rounded corners as exemplarily illustrated in FIG. 2A, but other shapes are possible as well. In cross section, the elastic elements 14 may have the shape of a wall and, in particular, the shape of a semi-cylinder. In one embodiment, each elastic element 14 has, in cross section, the shape of a slightly tilted "S" rising from the left and a mirrored "S" rising from the right. This double S-shape in a gradient of the rising edge enables a shallow transition from the support structure 13 to the elastic element 14. It should be pointed out that other cross-sectional shapes of the elastic elements 14 may also be provided.

The elastic elements 14 may be formed by depositing elastic material on the support structure 13. For this purpose appropriate deposition methods, for example, printing technologies such as screen printing or chemical or physical vapor deposition processes, may be used. Multiple utilization of such deposition processes make it possible to provide arbitrary shallow and steep gradients in the transition between the support structure 13 and the elastic element 14.

The material of the elastic elements 14 may be electrically insulating and may contain silicone or may even entirely consist of silicone. Silicone is both elastic and thermostable, thereby permitting testing at an elevated temperature. Furthermore, silicone materials may have a low spring constant, with the result that only low forces are necessary for the contact-connection of the semiconductor chips 10 to be tested.

Electrical contact elements 15 in the form of conductor tracks may be deposited on top of the elastic elements 14. The conductor tracks 15 may run on the elastic elements 14 and on the top surface 20 of the support structure 13. Due to the elastic elements 14 protruding from the top surface 20 of the support structure 13, the conductor tracks 15 can be arranged in three dimensions. In FIG. 2A parts of the elastic elements 15 are shown in enlarged illustrations. For reasons of clarity, the conductor tracks 15 are only shown in the enlarged illustrations. The conductor tracks 15 may be made of an electrically conductive material, for example, a metal or a metal alloy. In one embodiment, the conductor tracks 15 have tips 21 on the top of the elastic elements 14, which may be used to electrically contact the contact pads 16 of the semiconductor chips 10. The tips 21 may have various shapes, for example, the tips 21 may be sharp or stub or may have a sphere on top of it or may have the shape of a truncated pyramid or any other appropriate shape. The conductor tracks 15 can be electrically contacted through the support structure 13 and provide a connection possibility for an external circuit device which is not illustrated in FIG. 2A. The external circuit device may be embodied, for example, as a test device which supplies test signals to the semiconductor chips 10 to be tested and carries response signals away from the semiconductor chips 10.

The conductor tracks 15 may be deposited by any appropriate method, for example, physical or chemical vapor deposition, sputtering, electrochemical or electroless deposition. For example, metallization layers may be formed by sputtering and subsequent electrochemical reinforcement. A structural design may be effected by means of photolithographic processes.

A pitch distance between the electrical contact elements 15 may be smaller than 150 µm or smaller than 100 µm. Semiconductor chips 10 can thus be tested in the non-housed state.

The support structure 13 may have a planar top surface 20, or sections of the top surface 20 may be planar. The support structure 13 can be formed from ceramic or silicon or may be a PCB (printed circuit board). In one embodiment the conductor tracks 15 are only arranged on the top surface 20 of the support structure 13. In another embodiment, the conductor tracks 15 are also arranged on the bottom surface 22 of the support structure 13. In particular if the support structure 13 is implemented as a PCB, some of the conductor tracks 15 may run within the PCB. The different metallization layers may be connected by means of electrically conductive vias in the support structure 13.

One or more first channels 25 extend through the support structure 13 and may be connected to first openings (apertures) 26 in the top surface 20 of the support structure 13. The first openings 26 may be located in the areas of the support structure 13 which are enclosed by the elastic elements 14. The first channels 25 may also be connected to an opening 27, which may also be implemented as a valve (not illustrated in FIG. 2A) and which may be connected to a pump, such as a vacuum or low pressure pump (not illustrated in FIG. 2A). Some or even all of the first channels 25 may be connected to each other as illustrated in the embodiment of FIG. 2A. In one embodiment, each group of the first channels 25 which are connected to each other may be connected to an individual opening 27 containing a valve which can be connected to a vacuum pump.

Semiconductor chips 10 without a housing, i.e., so-called "bare semiconductor chips", which are not encapsulated with a mold compound, may be placed on the support structure 13 to be tested as illustrated in FIG. 2B. After the semiconductor chips 10 have been fabricated on a semiconductor wafer and after the semiconductor wafer has been cut to singulate the semiconductor chips (dies) 10 (i.e., to separate them into individual integrated circuit chips), a pick-and-place tool may place each semiconductor chip 10 on a respective one of the elastic elements 14.

The semiconductor chips 10 may have been manufactured on the same semiconductor wafer, but may alternatively have been manufactured on different wafers. Furthermore, the semiconductor chips 10 may be physically identical, but may also contain different integrated circuits and/or represent other components and/or may have different outer dimensions and/or geometries. The semiconductor chips 10 may have a thickness in the range between 50 µm and several hundred micrometers. The semiconductor chips 10 may be arranged over the support structure 13 with their first main surfaces 11 facing the support structure 13 and their second main surfaces 12 facing away from the support structure 13. The first main surfaces 11 of the semiconductor chips 10 may be active main surfaces. Contact pads 16 are located on the first main surfaces 11. The integrated circuits embedded in the semiconductor chips 10 can be electrically accessed via the contact pads 16. The contact pads 16 may be made of a metal, for example, aluminum or copper. The contact pads 16 may be regularly or irregularly arranged and may differ in terms of size and geometry.

The semiconductor chips 10 may also be packaged before they are placed on the support structure 13. The packaged semiconductor chips 10 may, for example, be chip scale packages or wafer level packages. The semiconductor chips 10 may be covered with mold material such that their active main surfaces are exposed from the mold material. The packages may, for example, be fan-out type packages. In this case, the encapsulation body made of mold material or any other appropriate material allows the redistribution layer to extend beyond the outline of the semiconductor chips 10. The external contact pads, which allow electrical access to the semiconductor chips 10 from outside of the packages, therefore do not need to be arranged within the outline of the semiconductor chips 10, but can be distributed over a larger area. The increased area which is available for arrangement of the external contact pads as a result of the encapsulation body means that the external contact pads cannot only be arranged at a great distance from one another, but that the maximum number of external contact pads which can be arranged there is likewise increased compared to the situation when all the external contact pads are arranged within the outline of the semiconductor chips.

When the semiconductor chips 10 rest on the elastic elements 14, their contact pads 16 are in electrical contact with the conductor tracks 15 deposited on the elastic elements 14. In particular, the needle-like tips 21 may facilitate an electrical contact between the contact pads 16 and the conductor tracks 15. It may be provided that each contact pad 16 which is placed over the elastic elements 14 is electrically coupled to an individual conductor track 15. The conductor tracks 15 ensure that the semiconductor chips 10 can be electrically coupled to an external circuit device, for example a test device.

The opening 27 (or the valve) of the first channels 25 may be connected to a vacuum pump which creates a low pressure p1 (or a vacuum) in the first channels 25 and also in the volumes 28 surrounded by the first main surfaces 11 of the semiconductor chips 10, the elastic elements 14 and the top surface 20 of the support structure 13. The low pressure p1 may be lower than the atmospheric pressure. The low pressure p1 holds the semiconductor chips 10 in place and ensures a good electrical contact between the contact pads 16 and the conductor tracks 15. The elastic (resilient) material of the elastic elements 14 provides an air tight seal between the semiconductor chips 10 and the elastic elements 14 when the first channels 25 are evacuated. After the first channels 25 have been evacuated, the valve, which connects the first channels 25 to the vacuum pump, may be set to retain the vacuum in the first channels 25 even when the vacuum pump is disconnected from the valve.

As illustrated in FIG. 2C, a removable frame 30 may be placed over the support structure 13. Means may be provided to hold the frame 30 in place. The frame 30 may be made of a rigid material, for example, a dielectric material or an electrically insulating PCB material. The material of the frame 30 and the electrically insulating material of the support structure 13 may have similar or identical thermal expansion coefficients. A foil 17 may be securely fastened to the frame 30, for example, by gluing or welding. When the frame 30 rests on the support structure 13, the foil 17 may be in physical contact with the second main surfaces 12 of the semiconductor chips 10. It may be provided that the foil 17 puts pressure on the semiconductor chips 10 in order to press the semiconductor chips 10 towards the elastic elements 14. The foil 17 may be made of an elastic material, for example, the foil 17 may contain silicone or polytetrafluoroethylene. The foil 17 may have a thickness in the range between some micrometers to some millimeters. The elasticity of the foil 17 may enable the foil 17 to follow the contour of the semiconductor chips 10 (i.e., to adapt to the second main surfaces 12 of the semiconductor chips 10).

The unpackaged semiconductor chips 10 resting on the elastic elements 14 are then subjected to tests. The tests may include burn-in testing wherein the semiconductor chips 10 are heated and/or cooled down while the integrated circuits embedded in the semiconductor chips 10 are electrically biased. The functionality of the semiconductor chips 10 may be tested during and/or after the heating/cooling. For burn-in tests heating and cooling devices, such as ovens, may be used to heat the semiconductor chips 10 to temperatures in the range from −40° C. to +150° C. or even outside this range. In addition, the semiconductor chips 10 may be subject to speed and functionality tests to check the performance of the integrated circuits. The memories embedded in the semiconductor chips 10 may be tested to determine which memory cells are defective. Furthermore, the contact pads 16 of the semiconductor chips 10 may be tested.

After the tests have been finished, the valve, which connects the first channels 25 to the vacuum pump, may be set to release the vacuum in the first channels 25 and the frame 30 together with the foil 17 may be removed so that the semiconductor chips 10 can be removed.

Devices for releasably receiving singulated semiconductor chips may have one, two, three or more vacuum zones. In FIGS. 3A-3B a device 300 is schematically illustrated in cross section that has three vacuum zones. Apart from the first channels 25 which are connected to the first openings 27 to create the low pressure p1, the device 300 contains one or more second channels 45 that extend through the support structure 13 and have second openings (apertures) 31 at one end in the top surface 20 of the support structure 13. The first openings 26 are located in the areas of the support structure 13 which are enclosed by the elastic elements 14. The second openings 31 are located outside the areas which are enclosed by the elastic elements 14. However, there are one or more elastic walls 32 that enclose the second openings 31. Additionally, the device 300 contains one or more third channels 46 that extend through the support structure 13 and have third openings 42 at one end in the top surface 20 of the support structure 13. The third openings 42 are located outside the areas which are enclosed by the elastic walls 32. In top plan view each of the elastic walls 32 may have the shape of a closed curve, which is a curve with no endpoints and which completely encloses an area of the top surface 20 of the support structure 13. The fabrication process of the elastic walls 32 may be similar or identical to the fabrication process of the elastic elements 14.

The second channels 45 may have an opening 33 at the remote end, which opening 33 may also be implemented as a valve (not illustrated in FIG. 3A) and which may be connected to a pump (not illustrated in FIG. 3A). Some or even all of the second channels 45 may be connected to each other. The third channels 46 may have an opening 43 at the remote end, which opening 43 may also be implemented as a valve and which may be connected to a pump (not illustrated in FIG. 3A). Some or even all of the third channels 46 may be connected to each other.

A fitting element 35 may be mounted to the top surface 20 of the support structure 13. Sealing elements 36 may be integrated into the fitting element 35. The sealing elements 36 may be made or rubber, silicone or any other appropriate material. The bottom surface 37 of the frame 30 may be embodied such that it matches to the fitting element 35 and the sealing elements 36 protruding from the fitting element 35.

A foil 17 is fastened to the frame 30. Furthermore, a plate or a lid 38 may cover the frame 30. The plate 38 may be made of a rigid material, for example, PCB material or glass or metal or semiconductor material. In particular, the plate 38 may be made of the same material as the frame 30 and/or the support structure 13.

In FIG. 3B the frame 30 rests on the support structure 13, and the sealing elements 36 ensure that the space between the foil 17 and the support structure 13 is tightly sealed. While the first openings 26 are used to create a low pressure p1 in order to hold the semiconductor chips 10 in place, the second openings 31 are used to create a low pressure p2 (or a vacuum) in volumes 39 defined by the elastic walls 32, the foil 17 and the top surface 20 of the support structure 13. The low pressure p2 may be lower than the atmospheric pressure. The low pressure p2 puts pressure on the portions of the foil 17 that are exposed to this low pressure p2 so that the foil 17 is pressed against the second main surfaces 12 of the semiconductor chips 10.

In order to create the low pressure p2 in the space 39, the openings 33 (or the valve) of the second channels 45 may be connected to a vacuum pump. The openings 33 may be connected to the same vacuum pump as the vacuum pump which is connected to the opening 27, but the openings 33 may also be connected to a different vacuum pump. The elastic material of the walls 32 ensure an air tight seal of the volumes 39.

FIGS. 4A-4C schematically illustrate a device 400 for releasably receiving singulated semiconductor chips 10 in top plan view. In FIG. 4A the support structure 13 of the device 400 is shown. The support structure 13 includes four carriers 40 each having four elastic elements 14 and one elastic wall 32 surrounding the four elastic elements 14. The carriers 40 may be PCBs or may be made of other material, such as plastics, metals or semiconductor materials. As can be seen from FIG. 4A each elastic element 14 surrounds a respective one of the first openings 26, and a number of second openings 31 are arranged outside the closed curves of the elastic elements 14, but inside the closed curve of the elastic wall 32. Furthermore, an elastic wall 41 having the shape of a closed curve wall surrounds all elastic walls 32. The elastic wall 41 may have a similar or identical cross section than the elastic elements 14 and/or the elastic walls 32. The elastic wall 41 may have been manufactured using the same or similar manufacturing processes as the manufacturing processes used for the elastic elements 14 and the elastic walls 32. The elastic wall 41 is surrounded by the fitting element 35. The sealing elements 36 are not illustrated in FIG. 4A.

FIG. 4B illustrates the support structure 13 after the semiconductor chips 10 have been placed over the elastic elements 14 with their first main surfaces 11 facing the support structure 13 and their second main surfaces 12 facing away from the support structure 13. The low pressure p1 generated through the first channels 25 and the first openings 26 in the support structure 13 holds the semiconductor chips 10 in place and ensures a good electrical contact to the electrical contact elements 15 (not shown in FIGS. 4A-4C).

FIG. 4C illustrates the device 400 after the frame 30 together with the foil 17 has been mounted on the fitting element 35. The low pressure p2 generated through the second channels 45 and the second openings 31 in the support structure 13 pulls the foil 17 towards the support structure 13 so that the foil 17 is pressed against the second main surfaces 12 of the semiconductor chips 10. After the frame 30 has been placed over the support structure 13, electrical tests of the semiconductor chips 10 may be performed as explained above.

FIG. 5 schematically illustrates the support structure 13 of a device 500 for releasably receiving singulated semiconductor chips 10 in top plan view. The support structure 13 of the device 500 is similar to the support structure 13 of the device 400 shown in FIG. 4A. The difference is that the support structure 13 of the embodiment shown in FIG. 5 has third openings (apertures) 42 in the top surface 20 of the support structure 13 which can be used to create a low pressure p3 (or a vacuum) by a vacuum pump. The third openings 42 are arranged outside the closed curves of the elastic walls 32, but inside the closed curve of the elastic wall 41. The low pressure p3 created by means of the third openings 42 pulls the foil 17 towards the support structure 13 when the frame 30 is mounted on the fitting element 35.

Figure 6B:
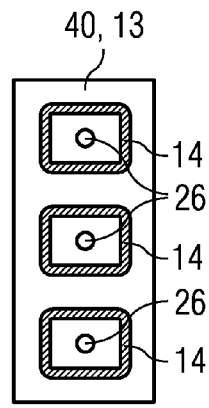
Figure 6C:
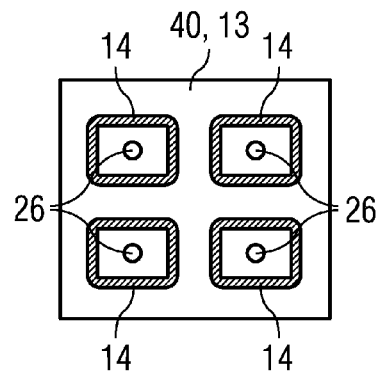
Figure 6D:
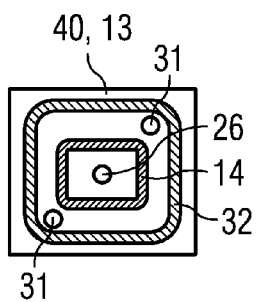
Figure 6E:
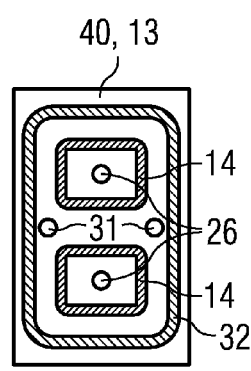
Figure 6F:
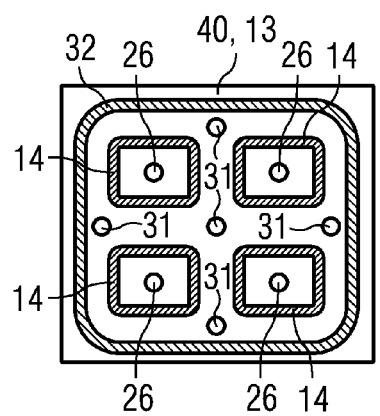
Figure 6G:
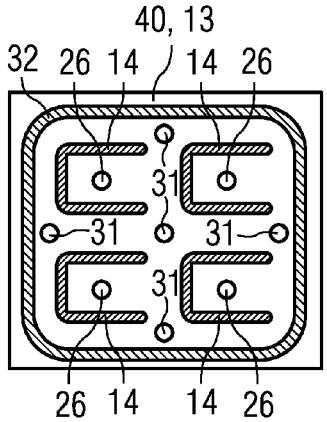
Figure 6H:
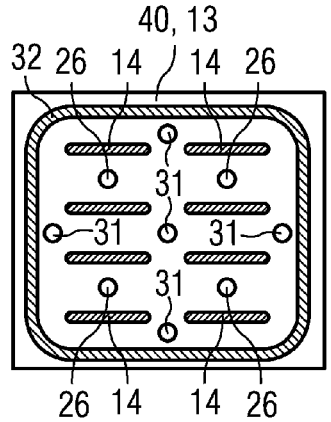
Figure 6I:
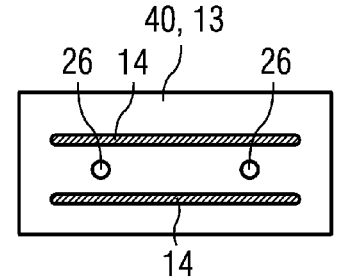

FIGS. 6A-6I schematically illustrate embodiments of modules containing elastic elements 14. In the embodiments of FIGS. 6D-6H the elastic elements 14 are surrounded by elastic walls 32. The elastic elements 14 and the elastic walls 32 may be mounted on carriers 40 which can be placed on the support structure 13 or, alternatively, the elastic elements 14 and the elastic walls 32 may be mounted directly onto the support structure 13. FIGS. 6A-6C show examples of single vacuum zones. Each of the elastic elements 14 shown in FIGS. 6A-6C surrounds one (or several) first openings 26. FIGS. 6D-6H show examples of dual vacuum zones. In these examples the elastic wall 32 surrounds the elastic elements 14, and the second openings 31 are arranged between the elastic elements 14 and the elastic wall 32. The first openings 26 and the elastic elements 14 can be used to hold the semiconductor chips 10 in place, whereas the second openings 31 and the elastic wall 32 can be used to attract the foil 17. In the embodiment of FIG. 6G the elastic elements 14 are open on one or more positions. In the embodiment of FIG. 6H each of the elastic elements 14 consists of two or more walls which may be arranged in lines. In the embodiment of FIG. 6I two or more elastic elements 14 are connected to each other, for example, by continuous walls.

Figure 7A:
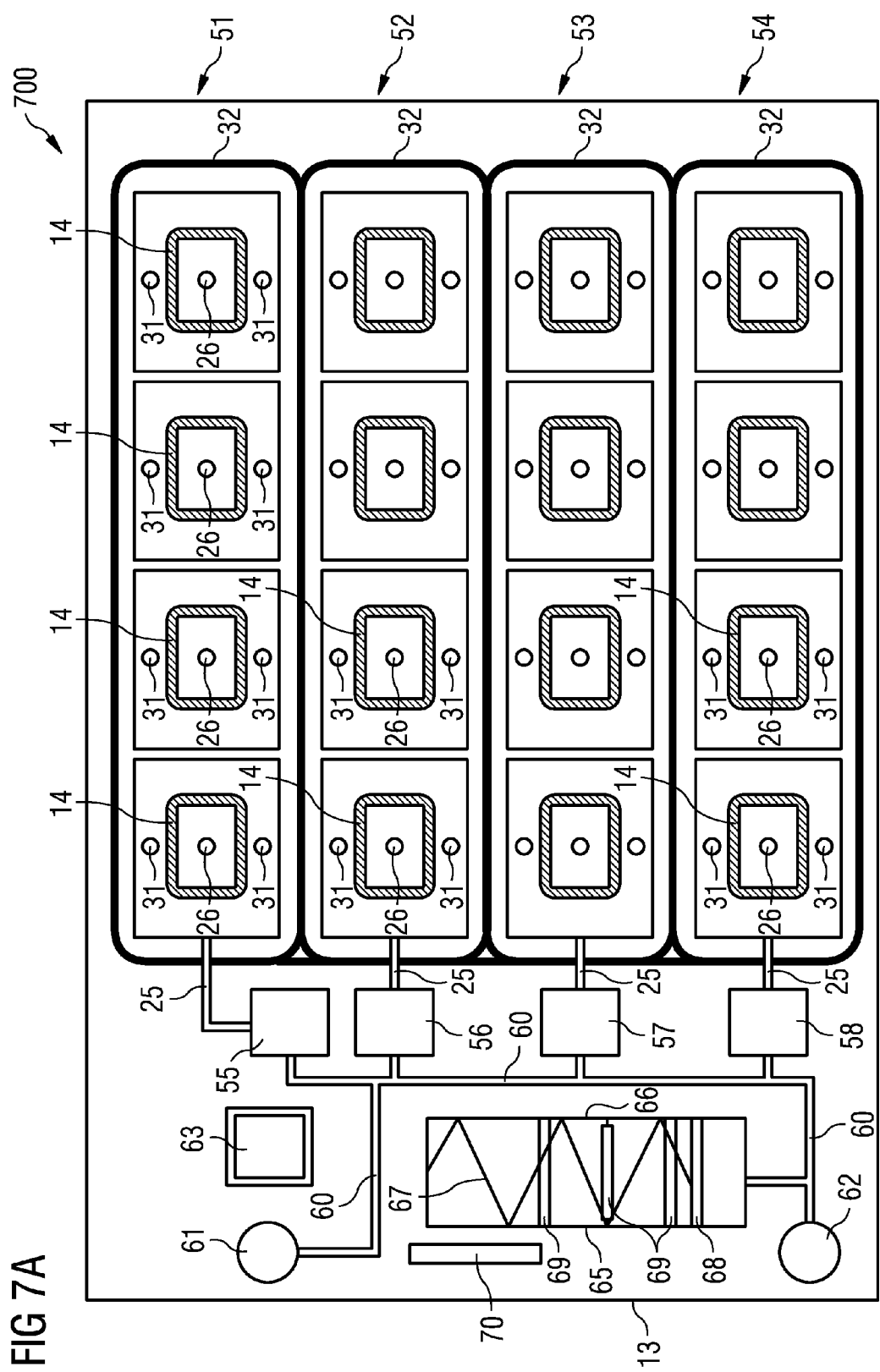
FIGS. 7A-7D schematically illustrate a plan view of one embodiment of a device including a support structure for releasably receiving singulated semiconductor chips and a plurality of valves connected to channels extending through the support structure.

FIG. 7A schematically illustrates a device 700 for releasably receiving singulated semiconductor chips 10 in top plan view. Four rows 51, 52, 53 and 54 of elastic elements 14 are mounted on the support structure 13 of the device 700. Each row 51-54 is surrounded by an elastic wall 32. The first openings 26 of each row 51-54 are connected to valves 55, 56, 57 and 58, respectively. Channels 60 within the support structure 13 connect the valves 55-58 to connectors 61 and 62. An external vacuum pump can be connected to the connectors 61, 62. Furthermore, the device 700 contains a control unit 63 for controlling the valves 55-58 and other valves which may be included in the device 700.

An apparatus 65 for measuring the pressure in the channels 60 may be mounted on the support structure 13. The apparatus 65 may consist of an at least partially transparent cylinder 66, a spring element 67, a piston (or slider) 68 and a scale 69. One end of the spring element 67 is attached to one end of the cylinder 66, and the remote end of the spring element 67 is attached to the piston 68. The piston 68 tightly seals the cylinder 66 and is configured to slide within the cylinder 66. The remote end of the cylinder 66 is connected to the channels 60. The position of the piston 68 within the cylinder 66 corresponds to the pressure in the channels 60. The scale 69, which may for example, consist of some marks on a transparent part of the cylinder 66, allows to measure the pressure in the channels 60.

The device 700 further includes one or more electrical connectors 70 which allow to connect the conductor tracks 15 (not illustrated in FIG. 7A) to an external test device.

The device 700 may include second openings 31 which may be connected to a vacuum pump by means of channels and valves (not illustrated in FIG. 7A).

When the device 700 is being equipped with the semiconductor chips 10, it may be provided that first the row 51 is loaded with the semiconductor chips 10. For that, only the valve 55 is opened and the valves 56-58 remain closed. Then semiconductor chips 10 are attached to the row 52. For that the valve 56 is opened. In this manner row after row can be loaded with semiconductor chips 10. When all elastic elements 14 have been equipped with semiconductor chips 10, a foil 17 may be placed over the elastic walls 32 (not illustrated in FIG. 7A), and electrical tests of the semiconductor chips 10 may be performed.

Figure 7B:
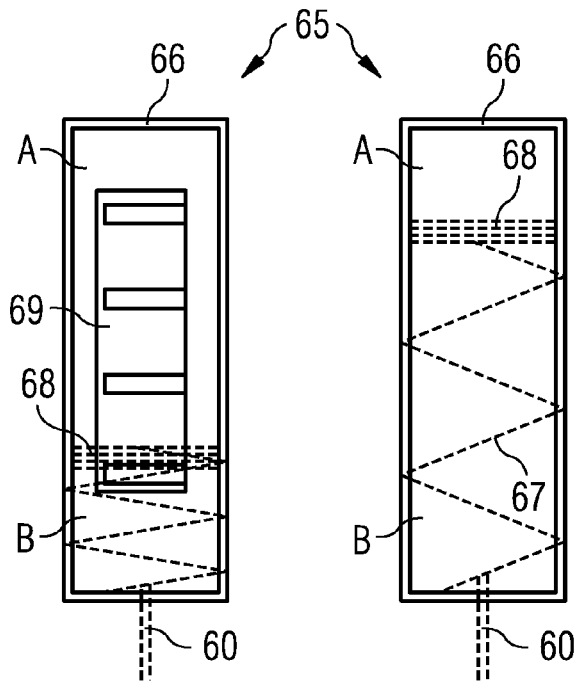

FIG. 7B schematically illustrates an embodiment of the apparatus 65 where the spring element 67 is connected to the end of the cylinder 66 to which the vacuum system is connected (via the channel 60). The piston 68 defines two chambers A and B within the cylinder 66, which are sealed from each other. The illustration on the right of FIG. 7B shows the situation where chamber B is open to the environment which means that the pressure in the chamber B is ambient pressure. Chamber A has a low pressure, and the volume of chamber A is minimized in this case. The illustration on the left of FIG. 7B shows the situation when chamber B is connected to the vacuum created by the vacuum pump.

Figure 7C:
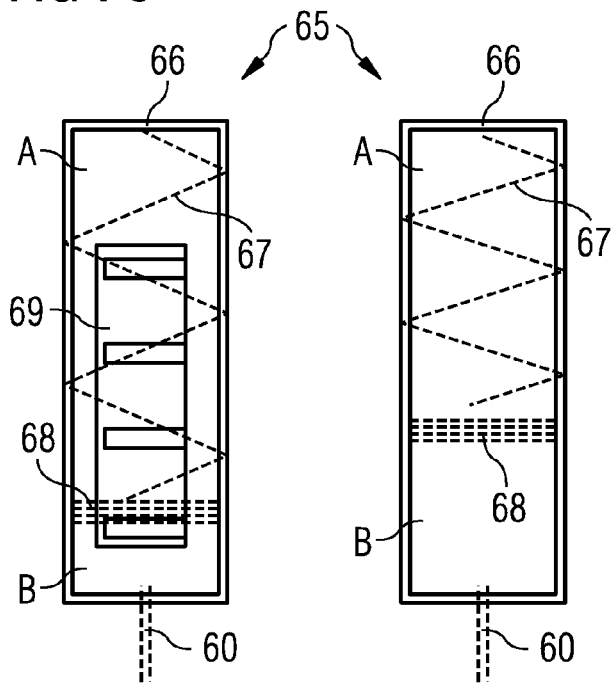

FIG. 7C schematically illustrates an embodiment of the apparatus 65 where the spring element 67 is connected to the end of the cylinder 66 which is sealed from the vacuum system. The illustration on the left of FIG. 7C shows the situation where chamber B is open to the environment which means that the pressure in chamber B is ambient pressure. The illustration on the right of FIG. 7C shows the situation where chamber B is connected to the vacuum created by the vacuum pump. In this case, chamber B has a pressure of, for example, 0.1 Pa and chamber A has a pressure of, for example, 0.2 Pa.

Figure 7D:
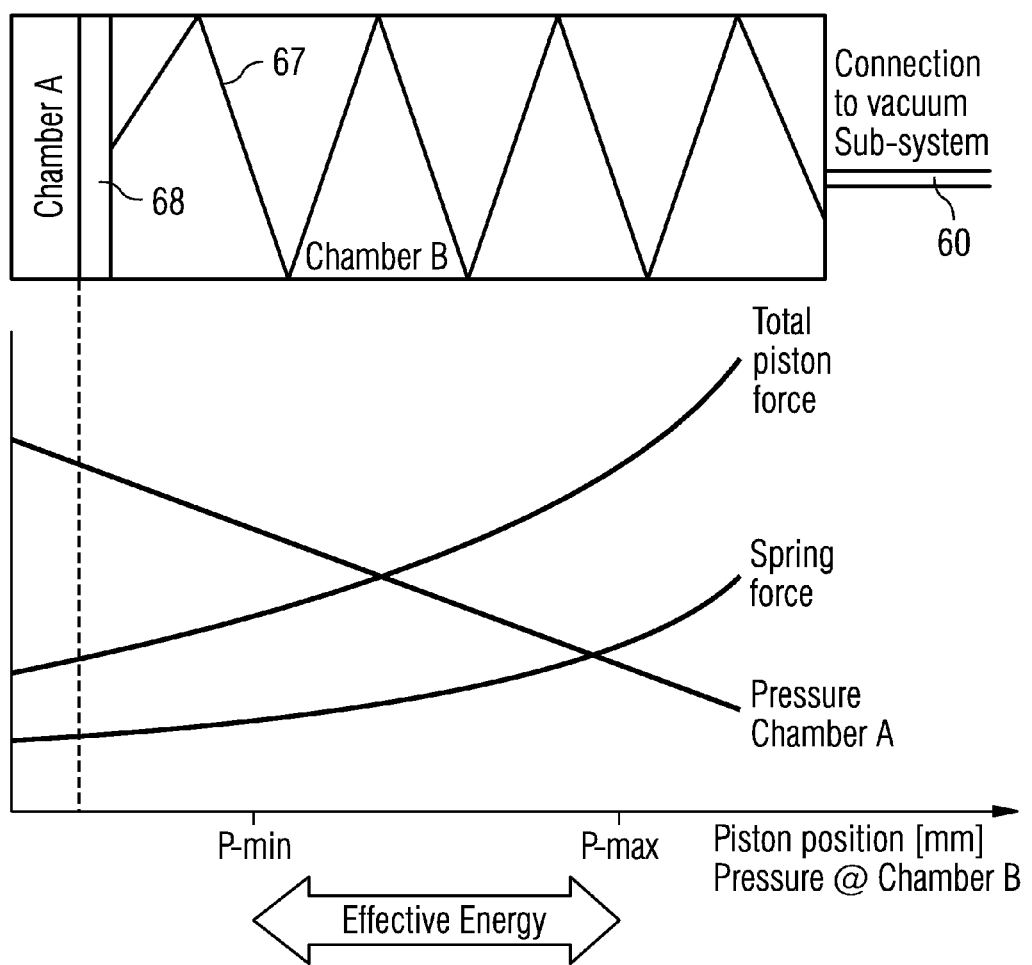

FIG. 7D shows a diagram where the total piston fore, the spring force and the pressure in chamber A are plotted versus the piston position. The apparatus 65 is used to store energy within the mobile vacuum subsystem as, for example, shown in FIG. 7A. The scale 69 on the cylinder 66 shows the position of the piston 68 and thus the energy stored in the apparatus 65. The force on the piston 68 is based on the low pressure in chamber A and the spring force on the piston 68. The apparatus 65 allows the setup of miniaturized vacuum systems without perfect sealing. The apparatus 65 enables easy handling of complex vacuum based devices between different systems, e.g., during a production flow.

Figure 8A:
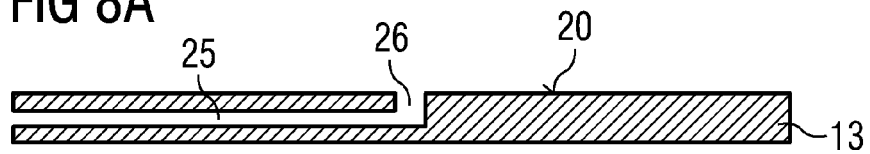
FIGS. 8A-8E schematically illustrate one embodiment of a method to fabricate a support structure for releasably receiving singulated small semiconductor chips.

FIGS. 8A-8E schematically illustrate a method to manufacture a device 800 for releasably receiving small semiconductor chips 10 in cross section. When the size of the semiconductor chips 10 is smaller than approximately 5×5 mm, the elastic elements 14 as, for example, shown in FIG. 2A need to be modified to be able to support the semiconductor chips 10. For producing such an elastic element 14 a support structure 13 is provided as illustrated in FIG. 8A. The support structure 13 of FIG. 8A may be identical to the support structure 13 of FIG. 2A. The support structure 13 may, for example, be a PCB with a first channel 25 extending through the PCB and a first opening 26 at the top surface 20 of the PCB.

Figure 8B:
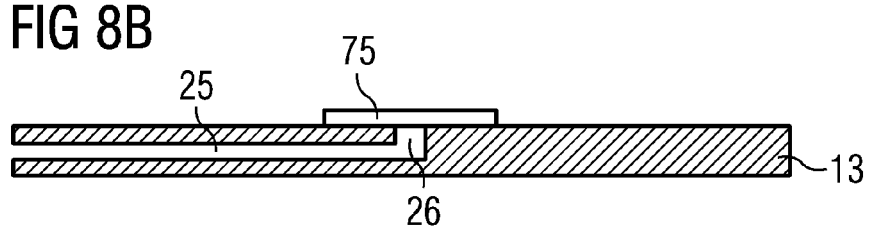
Figure 8C:
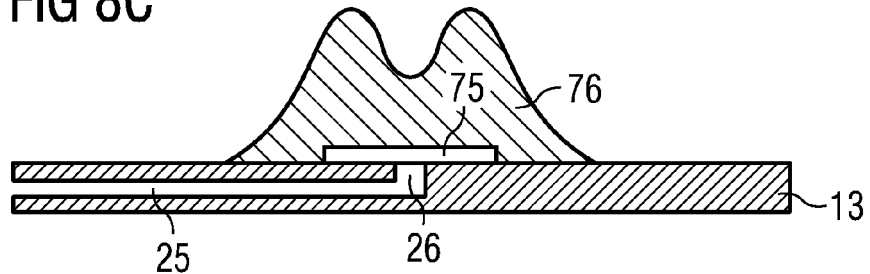

The first opening 26 of the support structure 13 may be covered with a tape or a foil 75 as illustrated in FIG. 8B. Then an elastic material 76, for example, a silicone material, may be deposited on the top surface 20 of the support structure 13 as illustrated in FIG. 8C. The elastic material 76 may be deposited such that the elastic material 76 forms a ring surrounding the first opening 26. Due to the small diameter of this ring, the elastic material 76 may cover the portion of the foil or tape 75 which is arranged directly above the first opening 26. Printing techniques, for example, screen printing, may be used to deposit the elastic material 76.

Figure 8D:
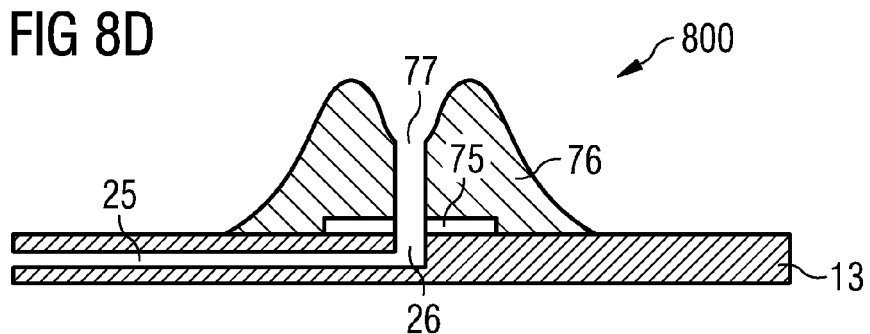

A hole 77 is then drilled through the elastic material 76 and the tape 75 such that the first opening 26 is exposed as illustrated in FIG. 8D. The hole 77 may be drilled by using a laser beam, a mechanical drill or any other appropriate technique. Due to its manufacturing process the elastic material 76 has the shape of a ring-shaped wall surrounding the hole 77. The surface of the elastic wall 76 may be coated with polyscience and electrical contact elements 15 in the form of conductor tracks may be deposited on the elastic wall 76 and the support structure 13 (not illustrated in FIG. 8D).

Figure 8E:
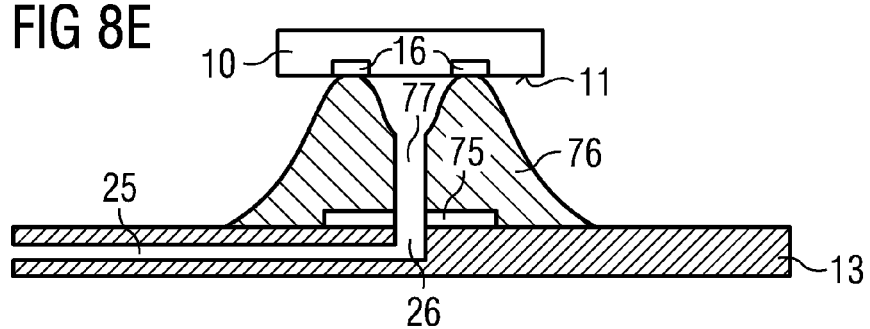

As illustrated in FIG. 8E, a semiconductor chip 10 having a first main surface 11 with dimensions smaller than 5×5 mm may be attached to the elastic wall 76 with the first main surface 11 facing the elastic wall 76. The semiconductor chip 10 is hold in place by evacuating the volume enclosed by the elastic wall 76 and the first main surface 11 of the semiconductor chip 10 through the hole 26, 77. Due to similar dimensions of the semiconductor chip 10 and the elastic wall 76, the contact pads 16 of the semiconductor chip 10 are in electrical contact with the conductor tracks deposited on the elastic wall 76. This allows to electrically couple the bare semiconductor chip 10 to an external test device and to perform tests of the semiconductor chip 10.

The bare semiconductor chips 10 tested with the devices described herein may be used for high temperature applications. The bare semiconductor chips 10 provide a good thermal integration to the circuit board during use. When testing the bare semiconductor chips 10, in particular, during burn-in tests, the semiconductor chips 10 need to be operated at a specified temperature. This requires a good thermal coupling of the semiconductor chips 10 during test and burn-in. The process variation may also cause a difference in the actual leakage current. The foil 17 which is placed over the second main surfaces 12 of the semiconductor chips 10 in the embodiments described herein allows a good thermal coupling of the semiconductor chips 10 to be tested to the environment. Moreover, the foil 17 protects the semiconductor chips 10 and the contact pads 16 from contamination such as dust particles. Additionally, the created low pressure holds the semiconductor chips 10 in place and ensures a good electrical contact between the contact pads 16 and the conductor tracks 15 as described above.

FIG. 9 schematically illustrates a device 900 for releasably receiving singulated semiconductor chips 10 in cross section. The support structure 13, the elastic elements 14 and the elastic wall 32 of the device 900 are identical to the support structure 13, the elastic elements 14 and the elastic wall 32 of the device 300 illustrated in FIG. 3A. Additionally, the device 900 contains a plate 80 (cooling plate or heat sink), which rests on the elastic wall 32 and is held in place by the low pressure p2 generated by means of the second openings 31 in the support structure 13. The bottom surface 81 of the plate 80 may be in physical contact with the second main surfaces 12 of the semiconductor chips 10, which face towards the plate 80. The bottom surface 81 of the plate 80 may be an essentially planar surface. The top surface 82 of the plate 80 may have fins and ridges to increase its surface area (not illustrated in FIG. 9). The plate 80 may be made of a material having a high thermal conductivity, for example, a metal or a metal alloy, such as copper or aluminum. The plate 80 may also be made of other appropriate materials, such as plastics, which are not electrically conductive but thermally conductive. The plate 80 allows to generate a precise temperature within the semiconductor chips 10 when tested.

FIGS. 10A-10C schematically illustrate embodiments for arranging the plate 80 over the semiconductor chips 10. In the embodiment of FIG. 10A the plate 80 only covers exactly one of the semiconductor chips 10. In the embodiment of FIG. 10B the plate 80 rests on a plurality of semiconductor chips 10, but does not cover the elastic wall 32. In the embodiment of FIG. 10C the plate 80 covers the entire top surface of the elastic wall 32, thus allowing to create a low pressure p2 which holds the plate 80 in place.

In the embodiments shown in FIGS. 9 and 10A-10C a foil 17 may be provided which covers the semiconductor chips 10 and the elastic walls 32. It may be provided that the foil 17 is arranged above the plate 80 or, alternatively, below the plate 80.

FIG. 11 schematically illustrates a device 1100 for releasably receiving singulated semiconductor chips 10 in cross section. The device 1100 is similar to the device 300 illustrated in FIG. 3B, but additionally two respective plates 85 and 86, which may be made of a metal or metal alloy or other appropriate thermally conductive materials, are arranged over each semiconductor chip 10. The plates 85 rest directly on the second main surface 12 of the respective semiconductor chips 10. Over the plates 85 the foil 17 is arranged, and the plates 86 rest on top of the foil 17. The bottom surfaces 87 of the plates 85 may be in physical contact with the second main surfaces 12 of the respective semiconductor chips 10, which face towards the plates 85. The bottom surfaces 87 of the plates 85 may be essentially flat surfaces. The top surfaces 88 of the plates 86 may have fins and ridges to increase their surface areas (not illustrated in FIG. 11). The plates 85, 86 may be made of materials having a high thermal conductivity, for example, metals or metal alloys, such as copper or aluminum. The plates 85, 86 may be fastened to the foil 17, for example, by gluing.

FIG. 12 schematically illustrates a device 1200 for releasably receiving singulated semiconductor chips 10 in cross section. The device 1200 is based on the device 900 illustrated in FIG. 9. Additionally, the device 1200 includes a frame 30, which is mounted to the fitting element 35 arranged on the support structure 13, and two foils 17 and 90, which both are fastened to the frame 30. The foil 90 may be stronger or more rigid than the foil 17. The foil 17 may seal the volume within the borders of the elastic walls 32 to create the low pressure p2. The plate 80 may be fastened to the top surface of the foil 90, for example, by gluing. The foil 90 may be strong enough to carry the plate 80. The plate 80 may overlap the elastic walls 32 as illustrated in FIG. 12. In one embodiment, the plate 80 does not overlap the elastic walls 32. The foil 17 may be in direct physical contact with the second main surfaces 12 of the semiconductor chips 10, the foil 90 may be in direct physical contact with the foil 17, and the plate 80 may be attached to the foil 90 by means of a glue.

FIG. 13 schematically illustrates a device 1300 for releasably receiving singulated semiconductor chips 10 in cross section. The device 1300 is a variation of the device 1200 illustrated in FIG. 12. In contrast to the device 1200, the device 1300 has holes 91 in the foil 17. The holes 91 are arranged in areas where the low pressure p2 is generated, i.e., within the borders of the elastic walls 32. Due to the holes 91 in the foil 17, the foil 90 is hold in place by the low pressure p2.

FIG. 14 schematically illustrates a device 1400 for releasably receiving singulated semiconductor chips 10 in cross section. The device 1400 is a variation of the device 1300 illustrated in FIG. 13. Instead of the plate 80 covering several semiconductor chips 10, respective plates 85, 86 are arranged over each of the semiconductor chips 10. In the device 1400 both plates 85, 86 are mounted on the top surface of the foil 90. Peltier elements 92 are placed between the plates 85, 86. Connection wires 93 of the Peltier element 92 may be connected to a control device (not illustrated in FIG. 14).

The Peltier elements 92 are active heat pumps which transfer heat from one side of the Peltier element 92 to the other side with consumption of electrical energy. The Peltier elements 92 allow to heat or to cool the semiconductor chips 10 to a desired temperature. Temperature sensors may additionally be placed next to the Peltier elements 92 in order to measure and adjust the temperature generated by the Peltier elements 92 (not illustrated in FIG. 14). It may be provided that the device 1400 loaded with the semiconductor chips 10 is placed in a heating and/or cooling device. The heating and/or cooling device may generate a rough temperature, and the Peltier elements 92 are used to adjust the temperature of the semiconductor chips 10 to the desired temperature value.

Figure 15A:
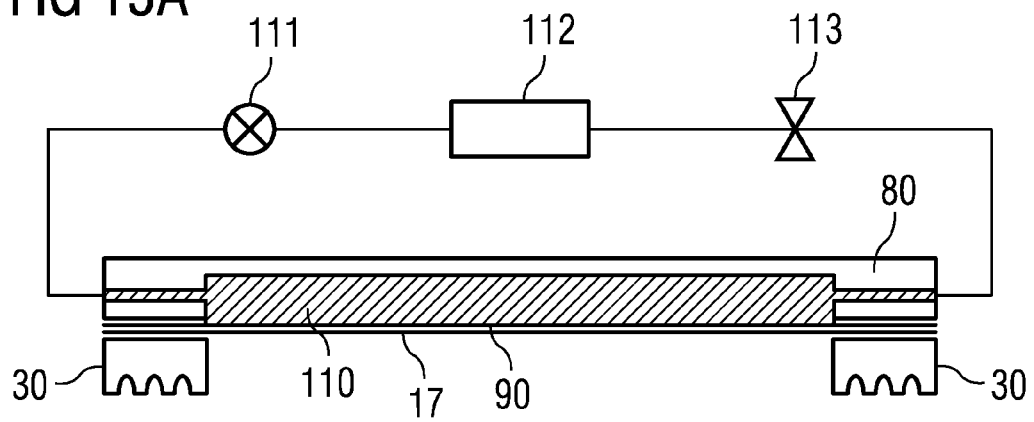
FIGS. 15A-15C schematically illustrate cross-sectional views of embodiments of a frame for cooling or heating semiconductor chips.
Figure 15B:
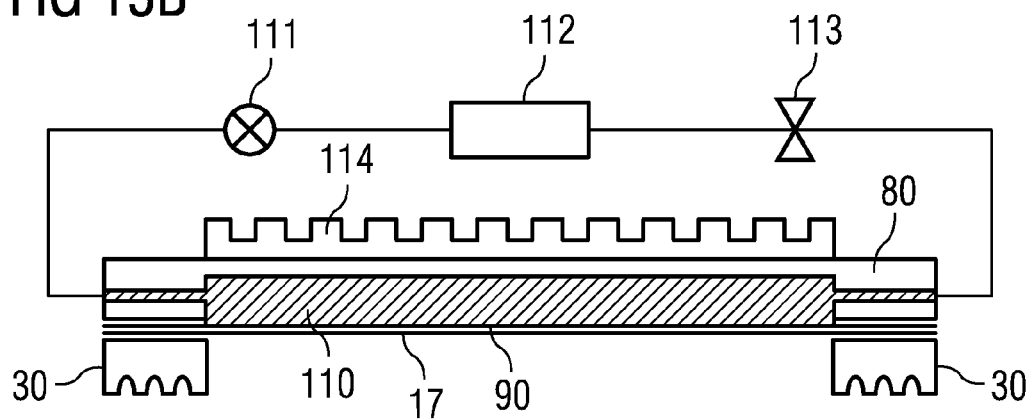
Figure 15C:
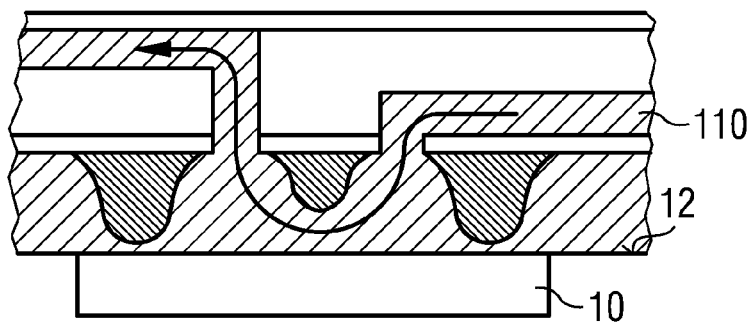

In FIGS. 15A-15C embodiments of the frame 30 are schematically illustrated. In the embodiment of FIG. 15A a heating and/or cooling plate 80 is placed over the frame 30, which may be made of a metal or metal alloy, for example, copper or aluminum. Further, the foils 17 and 90 are fastened to the frame 30. The soft foil 17 is optimized for generating the low pressure p2 when placed over the support structure 13. The foil 90 forms together with the frame 30 and the heating and/or cooling plate 80 a pad, which is filled with a liquid 110. The liquid 110 is coupled to a temperature adjustment loop. This loop includes a pump 111 for pumping the liquid 110 through the loop, a pressure adjustment unit 112 and a heating and/or cooling unit 113 to heat or cool the liquid 110 to a pre-determined temperature. The loop may further include a temperature sensor to measure and adjust the temperature generated by the heating and/or cooling unit 113 (not illustrated in FIG. 15A).

When the frame 30 is mounted over the support structure 13 equipped with the semiconductor chips 10, the foil 17 generates the low pressure p2 and the liquid 110 heats and cools the semiconductor chips 10 to the desired temperature. Instead of using the liquid 110, it may also be provided that a gas is heated and/or cooled in the temperature adjustment loop.

The top surface of the heating and/or cooling plate 80 may be essentially flat as illustrated in FIG. 15A. In the embodiment illustrated in FIG. 15B, a heat spreader 114 may be placed over the heating and/or cooling plate 80, wherein the top surface of the heat spreader 114 has fins and ridges to increase its surface area. In one embodiment, the heating and/or cooling plate 80 and the heat spreader 114 having fins and ridges are embodied in one piece.

As schematically and exemplarily illustrated in FIG. 15C, the chamber within the frame 30 containing the liquid 110 may be partitioned in order to direct the heated or cooled liquid 110 directly to the second main surface 12 of the semiconductor chip 10.

FIGS. 16A-16C schematically illustrate a device 1600 for releasably receiving singulated semiconductor chips 10 in top view (FIG. 16A) and cross section (FIGS. 16B-16C). The frame 30, the foil 17 and the plate 38 covering the frame 30 of the device 1600 form a volume 120. The volume 120 is coupled to another volume 121 via channels 122 in the frame 30. The volume 121 is at least partially enclosed by a flexible foil 123. The volumes 120 and 121 may be filled with a gas or a liquid.

FIG. 16B shows the frame 30 before it is mounted on the support structure 13. In this relaxed state, both volumes 120 and 121 are balanced. When the frame 30 is mounted on the fitting element 35 and the low pressure p2 is established, the low pressure p2 pulls the foil 17 towards the support structure 13. Due to the low pressure p2 (and, in particular, the low pressure p3), the volume 120 is increased. Since the volume 120 is coupled to the volume 121, the increase of the volume 120 decreases the volume 121 as illustrated in FIG. 16C. The frame 30 has an opening 124 to expose the foil 123, which partially encloses the volume 121, to atmospheric pressure.

FIGS. 17A-17C schematically illustrate a device 1700 for releasably receiving singulated semiconductor chips 10 in cross section. The device 1700 is almost identical to the device 1600 illustrated in FIGS. 16A-16C. In contrast to the device 1600, the foil 123 which partially encloses the volume 121 is not exposed to atmospheric pressure. Instead a compression chamber 130 encloses the foil 123. In the compression chamber 130 a desired pressure p4 can be adjusted via a valve which is not illustrated in FIGS. 17A-17C.

In FIG. 17A, which shows the frame 30 before it is mounted onto the fitting element 35, the pressure p4 in the pressure chamber may be the atmospheric pressure. In this state the volumes 120 and 121 are balanced.

When the frame 30 is mounted on the fitting element 35 and the low pressure p2 is established, the low pressure p2 pulls the foil 17 towards the support structure 13. Due to the low pressure p2 (and, in particular, the low pressure p3), the volume 120 is increased. Since the volume 120 is coupled to the volume 121, the increase of the volume 120 decreases the volume 121 as illustrated in FIG. 17B.

In FIG. 17C the pressure p4 in the compression chamber 130 is set to a high pressure. This high pressure p4 causes the volume 121 to decrease. Accordingly the pressure in the volumes 120 and 121 is increased such that the foil 17 applies a higher pressure onto the second main surfaces 12 of the semiconductor chips 10. In this way the additional contact force ensures that the contact pads 16 of the semiconductor chips 10 have a good electrical contact to the conductor tracks 15.

In one embodiment, the second channels 45 extending through the support structure 13 and the second openings 31 in the top surface 20 of the support structure 13 are omitted in the device 1700. Thus the pressure p2 cannot be established. Instead the high pressure p4 ensures that the foil 17 is pressed onto the second main surfaces 12 of the semiconductor chips 10.

FIGS. 18A-18B schematically illustrate a device 1800 for releasably receiving singulated semiconductor chips 10 in cross section. The device 1800 includes a support structure 13 which is identical to the support structure 13 of the device 300 illustrated in FIGS. 3A-3B. The frame 30 of the device 1800 is covered with a plate 38, which may, for example, be made of a PCB material. In the device 1800 the plate 38 has through holes 140 extending from the upper surface to the lower surface of the plate 38. The through holes 140 expose an upper surface 141 of a pad 142. The pad 142 is fit into the frame 30, and the upper surface 141 as well as the lower surface 143 of the pad 142 are made of a flexible material, such as a foil or tape. The portions of the upper surface 141 of the pad 142 that are covered with the plate 38 may be firmly attached to the plate 38. The pad 142 may be filled with a liquid, in particular, a liquid having a high thermal conductivity.

When the frame 30 is mounted on the support structure 13 and the low pressure p2 is applied via the second channels 45 and the openings 31, the lower surface of the pad 142 is pulled towards the support structure 13 such that pressure is applied to the second main surfaces 12 of the semiconductor chips 10 as illustrated in FIG. 18B. Due to the through holes 140 in the plate 38 covering the frame 30, the upper surface 141 of the pad 142 is indented when the pressure p2 is applied. The liquid contained in the pad 142 allows a good thermal coupling of the semiconductor chips 10 to the environment.

FIG. 19 schematically illustrates a device 1900 for releasably receiving a singulated semiconductor chip 10 in cross section (top) and top plan view (bottom). The device 1900 includes a support structure 13 with one or more elastic elements 14 and conductor tracks 15 as described above. It can be provided that only a single semiconductor chip 10 or two or more semiconductor chips 10 can be tested with the device 1900 at the same time. The semiconductor chip 10 is mounted on the elastic element 14 such that its contact pads 16 are in electrical contact with the conductor tracks 15 arranged on the elastic element 14 (not illustrated in FIG. 19). The support structure 13, which may be a PCB, is surrounded by a body 150, which may be made of molded plastics. The body 150 may include a vacuum chamber 151, which may, for example, surround the support structure 13 and which is connected to the first channel 25, which extends through the support structure 13 and is used to produce the low pressure p1 to hold the semiconductor chip 10 in place. The vacuum chamber 151 may be connected to an opening 152 of the body 150.

After the semiconductor chip 10 has been placed on the elastic element 14 with its first main surface 11 facing the conductor tracks 15 on the elastic element 14, a low pressure (or vacuum) p1 is created in the first channel 25 by using a vacuum pump, which is connected to the opening 152. The additional vacuum chamber 151 in the body 150 ensures that the low pressure p1 is robust. Subsequently, an elastic foil (or membrane) 17 is placed over the second main surface 12 of the semiconductor chip 10. The foil 17 is firmly attached to an essentially planar surface 153 of the body 150, which surrounds the semiconductor chip 10. For attaching the foil 17 to the body 150, gluing, welding or any other appropriate method may be used. In contrast to the embodiment described above, the foil 17 may not be attached to a frame before the foil 17 is attached to the body 150. After the attachment of the foil 17 to the body 150 a vacuum pump is connected to an opening 154 of the body 150. The opening 154 is connected to the second channels 45 (not illustrated in FIG. 19) in order to create a low pressure (or vacuum) p2 in a volume 155. The low pressure p2 in the volume 155 puts pressure on the portions of the foil 17 that are exposed to this low pressure p2 so that the foil 17 is pressed against the second main surface 12 of the semiconductor chip 10.

The vacuum pump is then disconnected from the openings 152 and 154 of the body 150. The openings 152 and 154 may be cone-shaped and a ball 156 may be placed in each of the openings 152 and 154. The balls 156 prevent an immediate loss of the low pressures p1 and p2 when the vacuum pump is disconnected from the openings 152 and 154. The openings 152 and 154 may then be sealed with foils (or membranes) 157 and 158, respectively. The foils 157 and 158 may be glued or welded onto the body 150 and ensure stable low pressures p1 and p2 at least for a certain time.

Subsequently, the desired tests of the semiconductor chip 10 are performed. Thereafter the low pressures p1 and p2 are relieved, the foil 17 is detached from the body 150 and the semiconductor chip 10 is removed from the elastic element 14. The foil 17 may be a disposable foil which is for single usage only.

FIGS. 20-22 schematically illustrate devices 2000-2200 for releasably receiving a singulated semiconductor chip 10 in cross section. The devices 2000-2200 are variations of the device 1900 illustrated in FIG. 19.

In the device 2000 illustrated in FIG. 20 the support structure 13 is enlarged when compared to the support structure 13 of the device 1900. The upper surface 20 of the support structure 13 forms the lower boundary of the vacuum chamber 151 formed in the body 150. Furthermore, pins 160 arranged over the openings 152 and 154 prevent the balls 156 from jumping out of the cone-shaped openings 152 and 154, in particular, when the vacuum pumps are connected to the openings 152 and 154. FIG. 20 also illustrates a top view of the opening 152.

The device 2100 illustrated in FIG. 21 has openings 152 and 154 which are tilted to a desired angle. This may make it easier to connect a vacuum pump to the openings 152 and 154.

The device 2200 illustrated in FIG. 22 includes a foil 17, which not only covers the semiconductor chip 10 and the planar surface 153 of the body 150, but also seals the openings 152 and/or 154. The openings 152 and 154 may be formed in the surface 153 of the body 150.

FIGS. 23-25 schematically illustrate devices 2300-2500 for releasably receiving a singulated semiconductor chip 10 in cross section (top) and top plan view (bottom). The devices 2300-2500 include the device 1900. According to further embodiments, the devices 2300-2500 include one of the devices 2000-2200 instead of the device 1900.

The device 2300 illustrated in FIG. 23 includes a frame 170 which is mounted on top of the device 1900. Planar portions of the lower surface of the frame 170 rest on the planar surface 153 of the body 150. The frame 170 includes clamps 171 which engage notches 172 at the side surfaces of the body 150. The clamps 171 hold the frame 170 in place. The frame 170 holds a pad 173 filled with a gel. The pad 173 is arranged over the semiconductor chip 10 and the foil 17 and protects the foil 17. Furthermore, the frame 170 may contain holes 174 above the pad 173. In the area where the pad 173 is arranged, the height of the frame 170 is increased to form a space in which the pad 173 is placed.

The device 2400 illustrated in FIG. 24 is similar to the device 2300. However, the device 2400 includes a cover 180 instead of the frame 170, which covers the body 150. The lower surface of the cover 180 is essentially planar and includes no holes. The cover 180 rests on the planar surface 153 of the body 150. A pad 173 containing a gel may be arranged between the foil 17 and the cover 180. Springs 181 may be attached to the cover 180 in order to fasten the cover 180 to the body 150.

The device 2500 illustrated in FIG. 25 does not include a flexible foil, but a rigid foil 182 which covers the semiconductor chip 10. The foil 182 may be made of a metal or metal alloy, for example, aluminum. Since the foil 182 is not flexible, the foil 182 may be pre-shaped to have the shape which is shown in FIG. 25. In particular, the foil 182 may have planar portions, which rest on the surface 153 of the body 150 and the second main surface 12 of the semiconductor chip 10. Furthermore, the foil 182 may have an indentation 183 which surrounds the semiconductor chip 10.

The foil 182 may be thermally conductive to ensure a good thermal coupling to the semiconductor chip 10. In particular, a heat sink plate may be placed over the foil 182. The openings 152 and 154 of the body 150 may be sealed with flexible foils 157 and 158, respectively.

FIGS. 26A-26E schematically illustrate a method for fabricating a device similar to the device 400 illustrated in FIG. 4A which includes a support structure 13 and one or more carriers 40 mounted on the support structure 13.

Figure 26A:
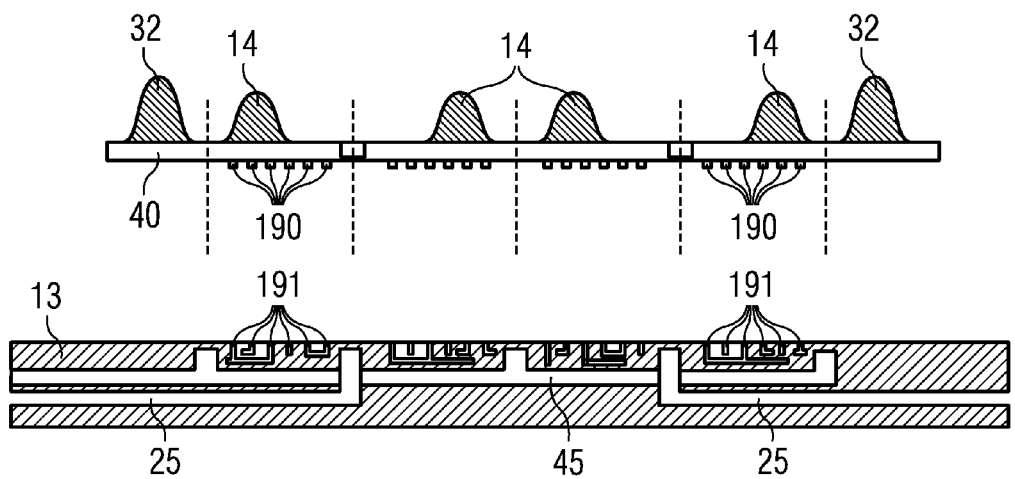
FIGS. 26A-26E schematically illustrate cross-sectional views of one embodiment of a method for fabricating a device including a support structure and carriers mounted on the support structure for releasably receiving singulated semiconductor chips.

FIG. 26A illustrates one of the carriers 40 and the support structure 13. The carrier 40 includes elastic elements 14, elastic walls 32 surrounding the elastic elements 14 and electrical contact elements 190. The electrical contact elements 190 are coupled to the electrical contact elements 15 which are arranged on the elastic elements 14 (not illustrated in FIG. 26A). The support structure 13 includes first channels 25, second channels 45 and optionally further channels. Furthermore, the support structure 13 includes electrical contact elements 191.

Figure 26B:
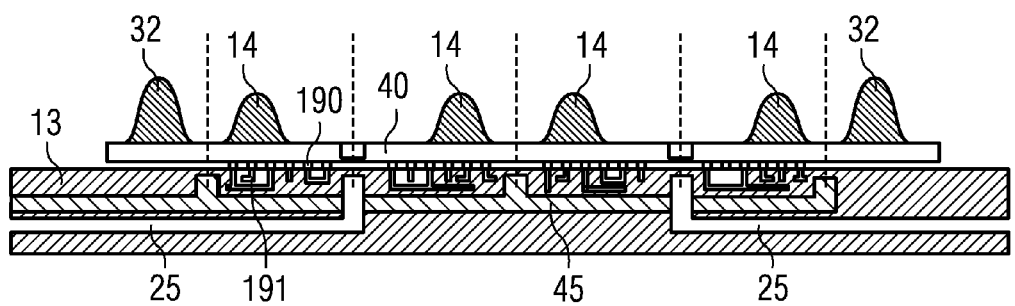

FIG. 26B illustrates the carrier 40 mounted on the support structure 13. The carrier 40 is placed over the support structure 13 such that the electrical contact elements 190 of the carrier 40 are in contact with corresponding electrical contact elements 191 of the support structure 13. The electrical contact elements 190 and 191 may be attached to each other by soldering or other appropriate means.

Figure 26C:
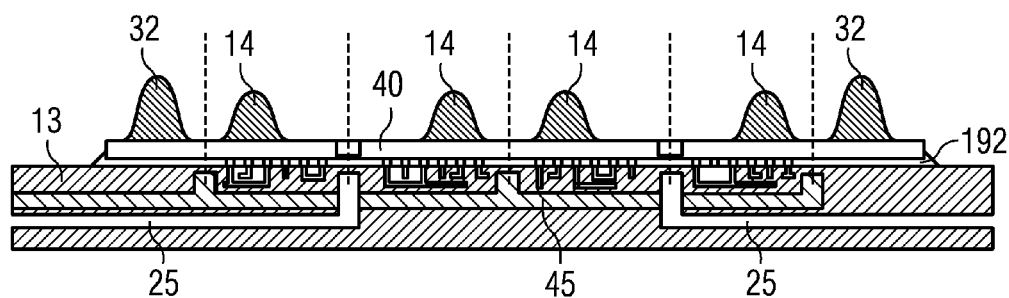
Figure 26D:
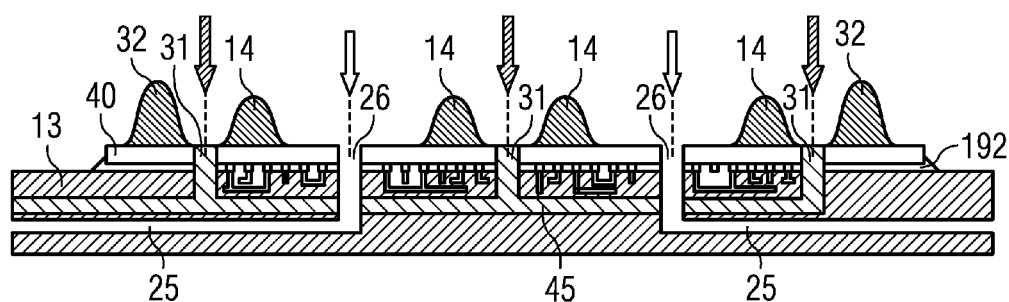

FIG. 26C illustrates an electrically insulating underfill material 192 which is deposited in the space between the carrier 40 and the support structure 13. Subsequently, holes are drilled in the carrier 40 as indicated by arrows 193 in FIG. 26D. The holes create first openings 26 of the first channels 25 and second openings 31 of the second channels 45.

Figure 26E:
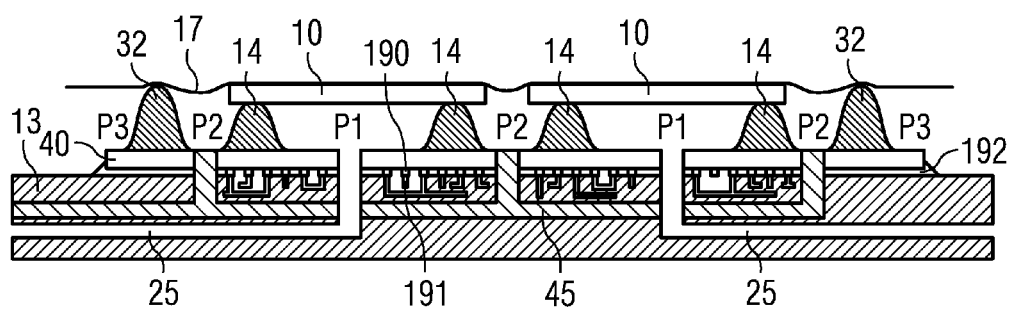

FIG. 26E illustrates the semiconductor chips 10 and the elastic foil 17 placed over the elastic elements 14 and the elastic walls 32. The semiconductor chips 10 can be electrically accessed via the electrical contact elements 191.

Figure 27A:
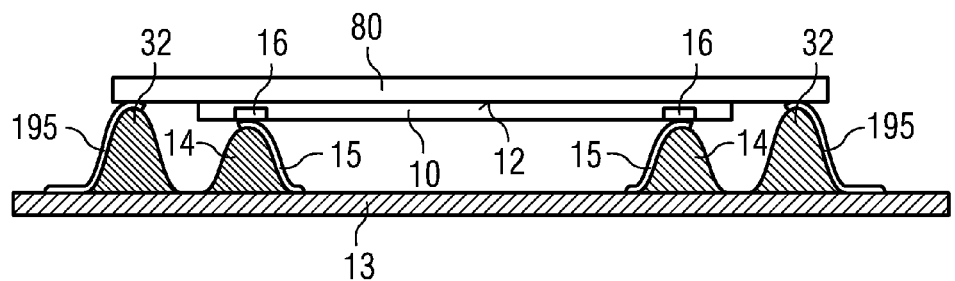
FIGS. 27A-27B schematically illustrate cross-sectional views of embodiments of a device including a support structure for releasably receiving singulated semiconductor chips and a plate arranged over the semiconductor chips which allows to contact the backsides of the semiconductor chips.
Figure 27B:
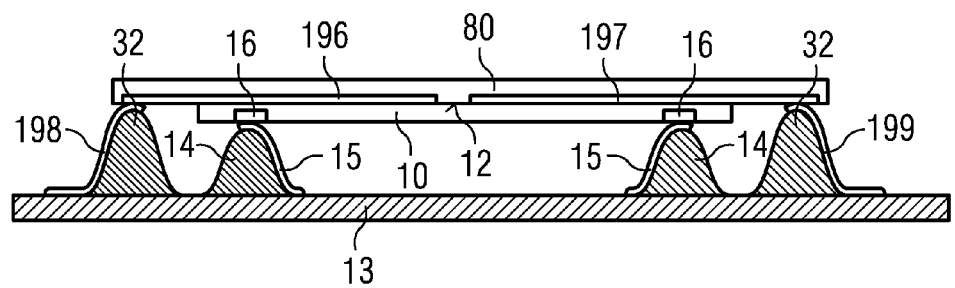

FIGS. 27A-27B schematically illustrate embodiments of the device 900 illustrated in FIG. 9 where a plate 80 is placed over the second main surface 12, i.e., the backside of the semiconductor chips 10. In FIG. 27A, the semiconductor chip 10 rests on the elastic element 14 and conductor tracks 15 are in contact with the contact pads 16 of the semiconductor chip 10. Furthermore, conductor tracks 195 are arranged on the elastic walls 32. The conductor tracks 15 and 195 can be electrically contacted through the support structure 13 and provide a connection possibility for an external circuit device which is not illustrated in FIG. 27A. In the embodiment of FIG. 27A, the conductor tracks 195 are in electrical contact with the plate 80, which is entirely made of an electrically conductive material such as a metal or a metal alloy. Since the plate 80 rests on the second main surface 12 of the semiconductor chip 10, the conductor tracks 195 allow to have electrical access to the backside of the semiconductor chip 10.

In the embodiment of FIG. 27B, the plate 80 is segmented in more than one zone, for example zones 196 and 197 as shown in FIG. 27B. The zones 196 and 197 of the plate 80 are electrically insulated from each other. The zone 196 is in contact with conductor track 198 and zone 197 is in contact with conductor track 199. The conductor tracks 198 and 199 are arranged at different locations on the elastic wall 32. The segmented zones 196 and 197 allow to contact different electrodes on the backside of the semiconductor chip 10. Moreover, it may be provided that the zones 196 and 197 are profiled (not illustrated in FIG. 27B).

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for receiving a singulated semiconductor chip, the semiconductor chip comprising a first main surface and a second main surface opposite the first main surface, the device comprising:
   a support structure;
   an elastic element arranged on the support structure;
   an electrical contact element arranged on the elastic element and adapted to be contacted to the first main surface of the semiconductor chip; and
   a foil adapted to be releasably arranged over the second main surface of the semiconductor chip.

2. The device of claim 1, wherein the foil is further adapted to be releasably attached to the support structure.

3. The device of claim 1, wherein the foil is further adapted to be releasably attached to a frame and the frame is adapted to be releasably attached to the support structure.

4. The device of claim 1, wherein the electrical contact element comprises a plurality of contact elements, and wherein the contact elements are arranged to correspond with contact pads that are arranged on the first main surface of the semiconductor chip.

5. The device of claim 1, wherein the elastic element has a closed curve shape.

6. The device of claim 1, further comprising an elastic wall arranged on the support structure, the elastic wall having a closed curve shape and surrounding the elastic element.

7. The device of claim 1, further comprising a plate adapted to be arranged directly over the second main surface of the semiconductor chip.

8. The device of claim 7, further comprising a further plate adapted to be arranged directly over the foil.

9. The device of claim 1, wherein the foil is flexible.

10. The device of claim 1, wherein the foil is rigid and has pre-shaped indentations.

11. The device of claim 1, wherein the foil has openings.

12. The device of claim 1, further comprising a Peltier element adapted to be arranged over the second main surface of the semiconductor chip.

13. The device of claim 1, further comprising a pad adapted to be arranged over the second main surface of the semiconductor chip, the pad having an adjustable volume.

14. A device for releasably receiving a singulated semiconductor chip, the semiconductor chip comprising a first main surface and a second main surface opposite the first main surface, the device comprising:
   a support structure;
   at least one elastic element arranged on the support structure;
   electrical contact elements arranged on the at least one elastic element and adapted to be contacted to the first main surface of the semiconductor chip;
   an elastic foil adapted to be arranged over the second main surface of the semiconductor chip; and
   a channel extending through the support structure and adapted to be connected to a pump in order to pull down the foil.

15. A device for receiving a singulated semiconductor chip, the semiconductor chip comprising a first main surface and a second main surface opposite the first main surface, the device comprising:
   a support structure comprising a channel extending through the support structure, the channel being connected to an opening in the support structure;
   an elastic element arranged on the support structure, wherein the elastic element has a closed curve shape, and wherein the opening is disposed within the closed curve shape;
   an electrical contact element arranged on the elastic element and adapted to be contacted to the first main surface of the semiconductor chip; and
   a foil adapted to be arranged over the second main surface of the semiconductor chip.

16. A device for receiving a singulated semiconductor chip, the semiconductor chip comprising a first main surface and a second main surface opposite the first main surface, the device comprising:
   a support structure comprising a second channel extending through the support structure, the second channel being connected to an opening in the support structure;
   an elastic element arranged on the support structure;
   an electrical contact element arranged on the elastic element and adapted to be contacted to the first main surface of the semiconductor chip, wherein the elastic element has a closed curve shape, and wherein the opening is disposed outside the closed curve of the elastic element; and
   a foil adapted to be arranged over the second main surface of the semiconductor chip.

17. A device for receiving a singulated semiconductor chip, the semiconductor chip comprising a first main surface and a second main surface opposite the first main surface, the device comprising:
   a support structure comprising an opening;
   an elastic element arranged on the support structure;
   an electrical contact element arranged on the elastic element and adapted to be contacted to the first main surface of the semiconductor chip;
   an elastic wall arranged on the support structure, the elastic wall having a closed curve shape and surrounding the elastic element, wherein the opening is disposed within the closed curve of the elastic wall; and
   a foil adapted to be arranged over the second main surface of the semiconductor chip.

18. A device for receiving a singulated semiconductor chip, the semiconductor chip comprising a first main surface and a second main surface opposite the first main surface, the device comprising:
   a support structure comprising a channel extending through the support structure and an opening;
   an elastic element arranged on the support structure;

an electrical contact element arranged on the elastic element and adapted to be contacted to the first main surface of the semiconductor chip;

an elastic wall arranged on the support structure, the elastic wall having a closed curve shape and surrounding the elastic element, wherein the channel is connected to the opening, and wherein the opening is disposed outside the closed curve of the elastic wall; and a foil adapted to be arranged over the second main surface of the semiconductor chip.

19. A device comprising:

a support structure;

an elastic element arranged on the support structure; and an electrical contact element arranged on the elastic element, the electrical contact element adapted to be contacted to a semiconductor chip, wherein the device is adapted to releasably receive the semiconductor chip.

20. The device of claim 19, further comprising a foil, the foil adapted to be releasably attached to a frame and further adapted to be releasably arranged over the semiconductor chip.

21. The device of claim 20, wherein the support structure comprises a first channel and an opening, the first channel being connected to the first opening, and wherein the first opening is disposed within the elastic element.

22. The device of claim 21, wherein the support structure comprises a second channel and a second opening, the second channel being connected to the second opening in, and wherein the second opening is disposed outside the elastic element.

23. The device of claim 22, further comprising an elastic wall arranged on the support structure, the elastic wall surrounding the elastic element.

24. The device of claim 23, wherein the support structure comprises a third channel and a third opening, the third channel being connected to the third opening, and wherein the third opening is disposed outside the elastic wall.

* * * * *